United States Patent
Ikeno et al.

(10) Patent No.: US 10,727,129 B2
(45) Date of Patent: Jul. 28, 2020

(54) METHOD OF MAKING A PEELED SUBSTRATE USING LASER IRRADIATION

(71) Applicants: Shin-Etsu Polymer Co., Ltd., Tokyo (JP); National University Corporation Saitama University, Saitama (JP); Shin-Etsu Chemical Co., Ltd., Tokyo (JP)

(72) Inventors: Junichi Ikeno, Saitama (JP); Yohei Yamada, Saitama (JP); Hideki Suzuki, Saitama (JP); Hitoshi Noguchi, Tokyo (JP)

(73) Assignees: SHIN-ETSU POLYMER CO., LTD., Tokyo (JP); NATIONAL UNIVERSITY CORPORATION SAITAMA UNIVERSITY, Saitama (JP); SHIN-ETSU CHEMICAL CO., LTD., Tokyo (JP)

( * ) Notice: Subject to any disclaimer, the term of this patent is extended or adjusted under 35 U.S.C. 154(b) by 22 days.

(21) Appl. No.: 15/957,256

(22) Filed: Apr. 19, 2018

(65) Prior Publication Data

US 2018/0315657 A1    Nov. 1, 2018

(30) Foreign Application Priority Data

Apr. 26, 2017  (JP) ................................. 2017-087194

(51) Int. Cl.
*C30B 33/02*    (2006.01)
*H01L 21/78*    (2006.01)
(Continued)

(52) U.S. Cl.
CPC ...... *H01L 21/7813* (2013.01); *B23K 26/0006* (2013.01); *B32B 43/006* (2013.01);
(Continued)

(58) Field of Classification Search
CPC .. C30B 1/00; C30B 1/02; C30B 29/00; C30B 29/10; C30B 29/16; C30B 30/00;
(Continued)

(56) References Cited

U.S. PATENT DOCUMENTS

2009/0056513 A1 *  3/2009  Baer ..................... B28D 1/221
                                                                    83/15

FOREIGN PATENT DOCUMENTS

JP    2001080996 A     3/2001
JP    2013049161 A  *  3/2013
(Continued)

OTHER PUBLICATIONS

Samant, et al. publication entitled "Laser machining of structural ceramics—A review," Journal of the European Ceramic Society, vol. 29, pp. 969-93 (2009). (Year: 2009).*
(Continued)

*Primary Examiner* — Kenneth A Bratland, Jr.
(74) *Attorney, Agent, or Firm* — Nath, Goldberg & Meyer; Jerald L. Meyer

(57) ABSTRACT

A substrate manufacturing method includes: a first step of disposing a condenser for condensing a laser beam in a non-contact manner on a surface 20r of a magnesium oxide single crystal substrate 20 to be irradiated; and a second step of irradiating a laser beam to a surface of the magnesium oxide single crystal substrate 20 and condensing the laser beam into an inner portion of the single crystal member under designated irradiation conditions using the condenser, and at a same time, two-dimensionally moving the condenser and the magnesium oxide single crystal substrate 20 relatively to each other, and sequentially forming processing marks to sequentially allow planar peeling.

2 Claims, 28 Drawing Sheets

(51) Int. Cl.
  *H01L 21/02* (2006.01)
  *B23K 26/00* (2014.01)
  *C30B 29/16* (2006.01)
  *B32B 43/00* (2006.01)
  *C30B 33/06* (2006.01)

(52) U.S. Cl.
  CPC .............. *C30B 29/16* (2013.01); *C30B 33/02* (2013.01); *C30B 33/06* (2013.01); *H01L 21/02414* (2013.01); *H01L 21/02527* (2013.01)

(58) Field of Classification Search
  CPC ......... C30B 31/00; C30B 31/20; C30B 33/00; C30B 33/02; C30B 33/06; H01L 21/02414; H01L 21/02527; H01L 21/7813; B23K 26/0006; B32B 43/006
  USPC ..................... 117/2–4, 7, 904, 915, 937, 944
  See application file for complete search history.

(56) References Cited

FOREIGN PATENT DOCUMENTS

| | | |
|---|---|---|
| JP | 2015059069 A | 3/2015 |
| JP | 2015-74002 A | 4/2015 |
| JP | 2015119076 A | 6/2015 |
| WO | 2013/115353 A1 | 8/2013 |

OTHER PUBLICATIONS

Extended European Search Report dated Oct. 1, 2018 issued in corresponding European Application No. 18168718.7.
Yan, et al., "CO2 laser peeling of Al2O3 ceramic and an application for the polishing of laser cut surfaces", Journal of the European Ceramic Society, vol. 33, pp. 1893-1905, 2013.
Samant, et al., "Laser machining of structural ceramics", Journal of the European Ceramic Society, vol. 29, pp. 969-993, 2009.
EP Official Office Action; Application No. 18168718.7 dated Sep. 16, 2019.

\* cited by examiner (EXAMPLE 1)

| LASER TYPE (YAG LASER IN ALL CASES) | Jenlas | | HIPPO | PHAROS |
|---|---|---|---|---|
| WAVELENGTH nm | 1064 | | 532 | 1024 |
| REPETITION FREQUENCY kHz | 35 | 50 | 15 | 200 |
| PULSE WIDTH | 20ns | 60ns | 9ns | 10ps |
| OUTPUT W | 5 | 1 , 2 | 1.0 , 2.3 | 1.0 |
| DEFOCUS AMOUNT $\mu$m | 0 , 100 | | 100 , 150 , 200 | 100 , 150 , 200 |
| RESULT | LASER BEAM DID NOT ENTER MgO SINGLE CRYSTAL SUBSTRATE VERY MUCH | | LASER BEAM ENTERED MgO SINGLE CRYSTAL SUBSTRATE, WHERE MACHINING MARKS WERE FORMED | |

FIG. 4

(EXAMPLE 2)

| LASER TYPE | | | PHAROS (YAG LASER) | | | |
|---|---|---|---|---|---|---|
| WAFER TO BE MACHINED (MgO WAFER) | | | (100), 50.8mm φ, 300 μ mt | | | |
| WAVELENGTH nm | | | 1024 | | | |
| REPETITION FREQUENCY kHz | | | 200 | | | |
| PULSE WIDTH ps | | | 10 | | | |
| OUTPUT W | | | 0.1 | 0.3 | 0.5 | 1.0 |
| DEFOCUS AMOUNT μm | | | 50 | | | |
| MACHINING CONDITION | LINE MACHINING | DOT PITCH μm | 1.0 | | | |
| | | LINE PITCH μm | 20 | | | |
| | | LINE LENGTH mm | 20 | | | |
| | | NUMBER OF LINES | 100 | | | |
| OBJECTIVE LENS | ADAPTIVE WAVELENGTH RANGE | | IR | | | |
| | MAGNIFICATION | | 100 | | | |
| | NA | | 0.80 | | | |
| | CORRECTION RING (MEMORY VALUE) | | 0.30 | | | |

(OUTPUT 0.1W   DOT PITCH 1μm   OFFSET 10μm          (CRACK DID NOT
DEFOCUS AMOUNT 50μm   CORRECTION RING 0.3)           PROPAGATE)

(OUTPUT 0.3W   DOT PITCH 1μm   OFFSET 10μm
DEFOCUS AMOUNT 50μm   CORRECTION RING 0.3)   (CRACK PROPAGATED)

(OUTPUT 0.5W   DOT PITCH 1μm   OFFSET 10μm
DEFOCUS AMOUNT 50μm   CORRECTION RING 0.3)   (CRACK PROPAGATED)

(OUTPUT 1.0W   DOT PITCH 1μm   OFFSET 10μm
DEFOCUS AMOUNT 50μm   CORRECTION RING 0.3)   (CRACK PROPAGATED)

FIG. 13

(EXAMPLE 3)

| LASER TYPE | | | PHAROS (YAG LASER) | | |
|---|---|---|---|---|---|
| WAFER TO BE MACHINED (MgO WAFER) | | | (100) 50.8mm $\phi$, 300 $\mu$ mt | | |
| WAVELENGTH nm | | | 1024 | | |
| REPETITION FREQUENCY kHz | | | 200 | | |
| PULSE WIDTH | | | 10ps | | |
| OUTPUT W | | | 0.5 | | |
| DEFOCUS AMOUNT $\mu$m | | | 50 | | |
| MACHINING CONDITION | RESPECTIVE LINES | DOT PITCH $\mu$m | 1.0 | | |
| | | LINE PITCH $\mu$m | 50 | 20 | 10 |
| | | LINE LENGTH mm | 20 | | |
| | PLANE MACHINING REGION | | 10mm × 20mm (RECTANGULAR REGION) | | |
| OBJECTIVE LENS | ADAPTIVE WAVELENGTH RANGE | | IR | | |
| | MAGNIFICATION | | 100 | | |
| | NA | | 0.80 | | |
| | CORRECTION RING (MEMORY VALUE) | | 0.30 | | |

FIG. 14

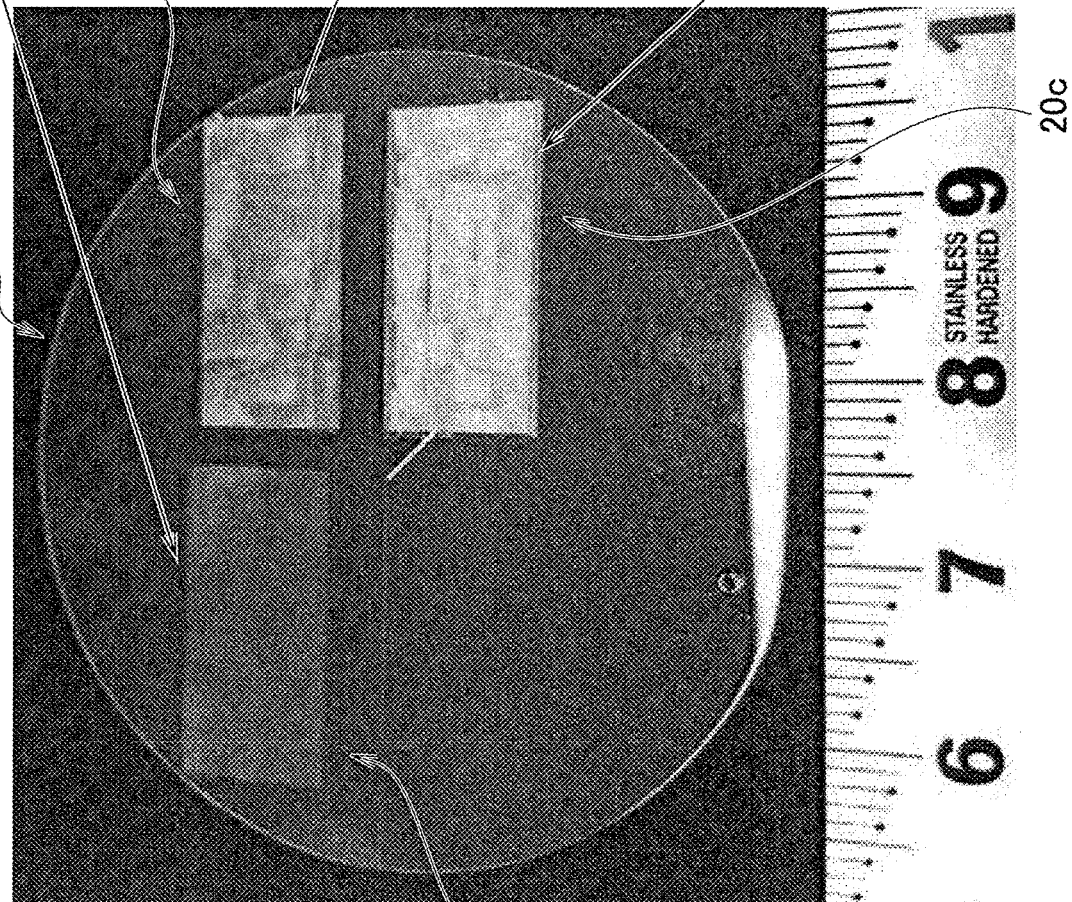

| OUTPUT | W | 0.5 |
|---|---|---|
| OSCILLATION FREQUENCY | kHz | 200 |
| PULSE WIDTH | ps | 10 |
| CORRECTION RING (MEMORY VALUE) | | 0.3 |
| DEFOCUS AMOUNT | mm | 0.05 |
| DOT PITCH | μm | 1 |
| LINE PITCH | μm | 50 |

| OUTPUT | W | 0.5 |
|---|---|---|
| OSCILLATION FREQUENCY | kHz | 200 |
| PULSE WIDTH | ps | 10 |
| CORRECTION RING (MEMORY VALUE) | | 0.3 |
| DEFOCUS AMOUNT | mm | 0.05 |
| DOT PITCH | μm | 1 |
| LINE PITCH | μm | 20 |

| OUTPUT | W | 0.5 |
|---|---|---|
| OSCILLATION FREQUENCY | kHz | 200 |
| PULSE WIDTH | ps | 10 |
| CORRECTION RING (MEMORY VALUE) | | 0.3 |
| DEFOCUS AMOUNT | mm | 0.05 |
| DOT PITCH | μm | 1 |
| LINE PITCH | μm | 10 |

APPLIED DOT
FIG. 20A
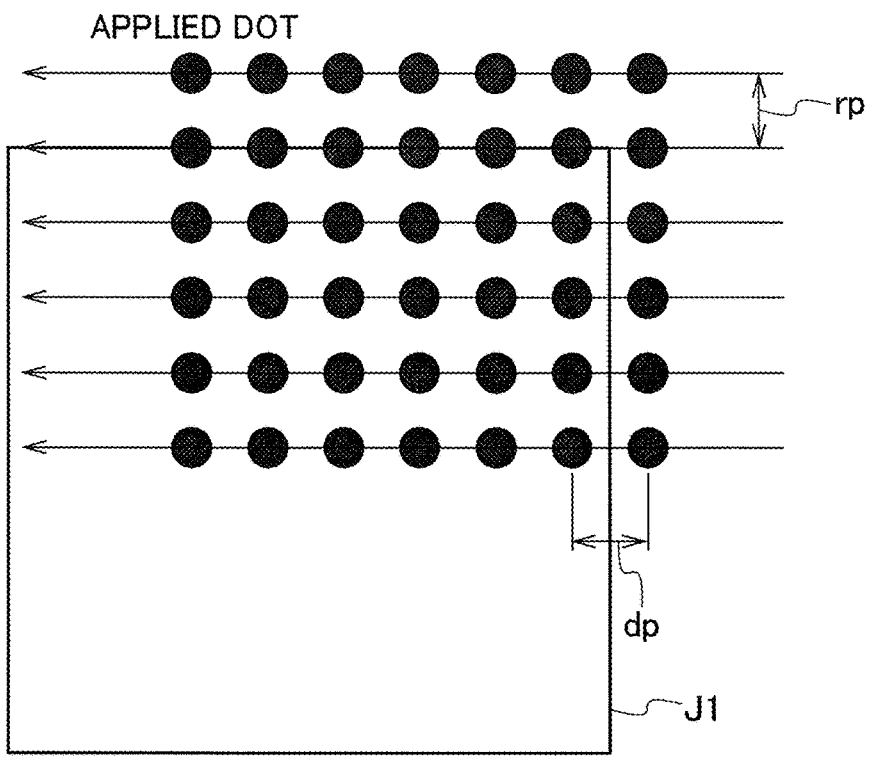
FIG. 20B
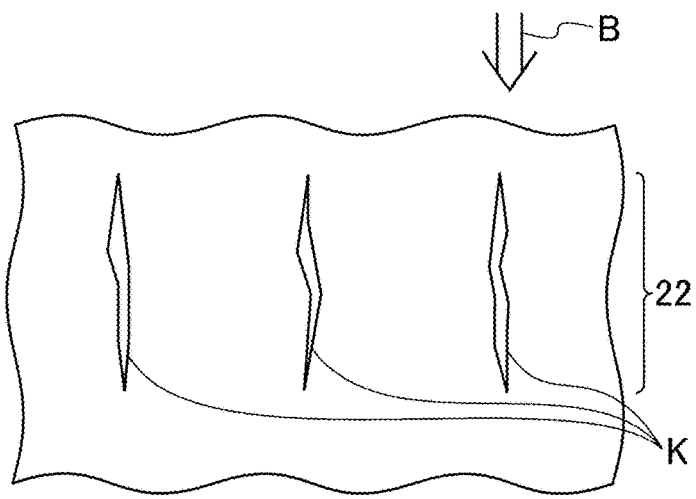
FIG. 20C
| WAVELENGTH (nm) | 1030 |
| --- | --- |
| PULSE WIDTH (ps) | 10 |
| OUTPUT (mW) | 25 |
| NA | 0.85 |
| CORRECTION RING (mm) | 0.3 |
| DF ($\mu$m) | -50 |
| DOT PITCH dp ($\mu$m) | 7 |
| LINE PITCH rp ($\mu$m) | 4 |

FIG. 23
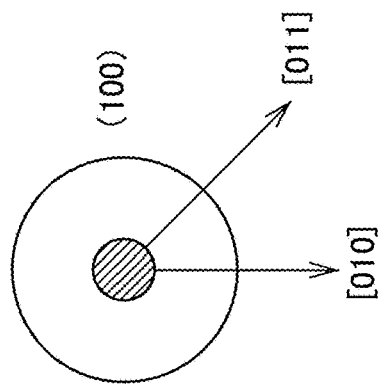
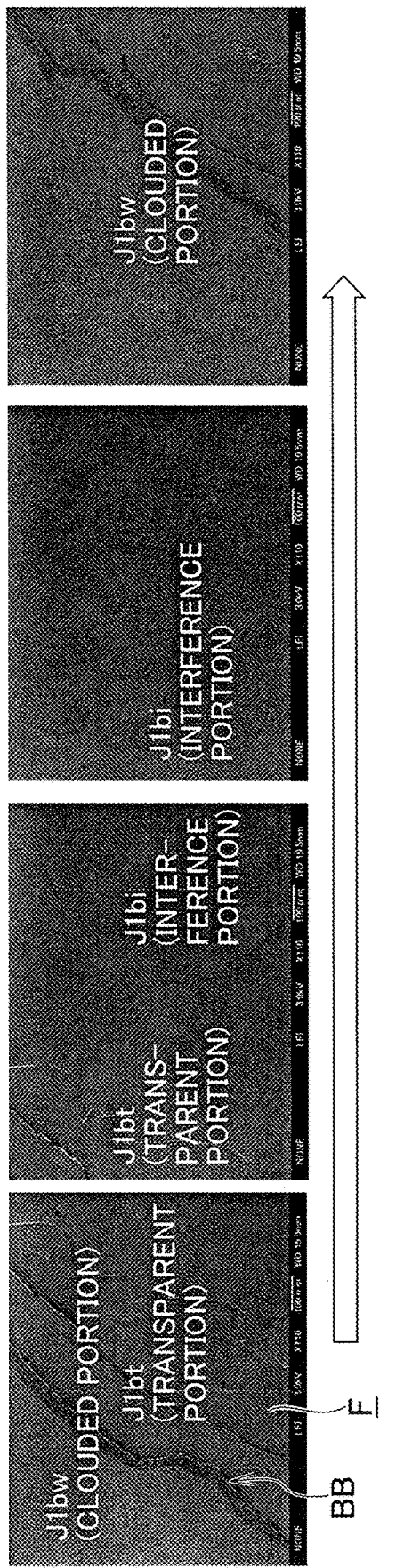

LS

FIG. 31A
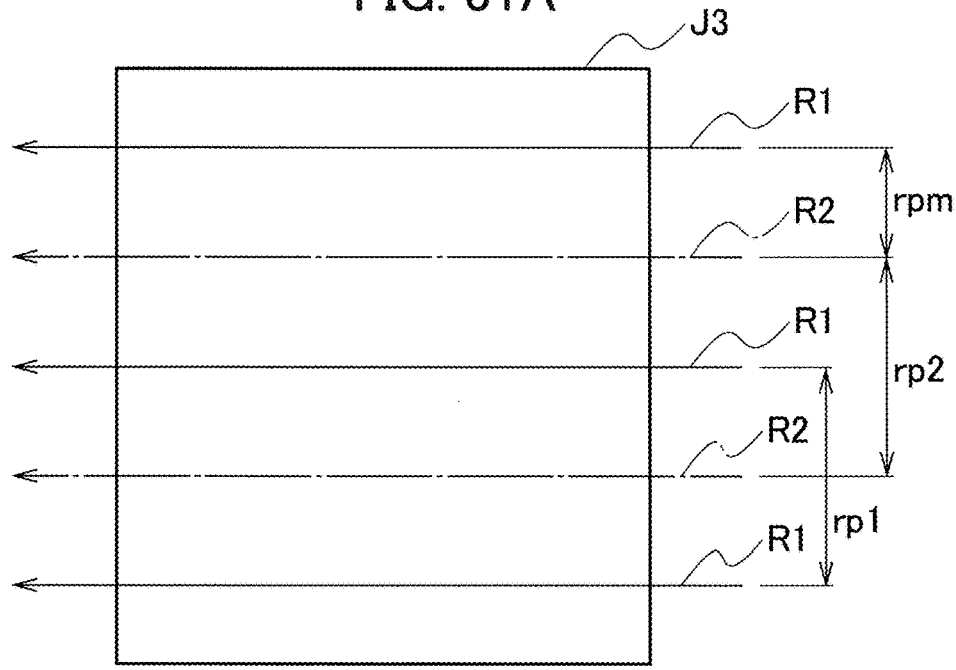
← ——— (MACHINED BY FIRST IRRADIATION)
← — · — (MACHINED BY SECOND IRRADIATION)
FIG. 31B
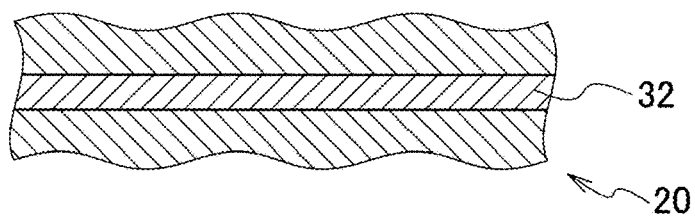
FIG. 32
| WAVELENGTH (nm) | 1030 |
| --- | --- |
| PULSE WIDTH (ps) | 10 |
| OUTPUT (mW) | 25 |
| NA | 0.85 |
| CORRECTION RING (mm) | 0.3 |
| DF ($\mu$m) | −50 |
| DOT PITCH dp ($\mu$m) | 7 |
| LINE PITCH rp1 ($\mu$m) | (FIRST IRRADIATION) 8 |
| LINE PITCH rp2 ($\mu$m) | (SECOND IRRADIATION) 8 |

METHOD OF MAKING A PEELED SUBSTRATE USING LASER IRRADIATION

CROSS REFERENCE TO RELATED APPLICATION

This application claims priority of Japanese patent application No. 2017-87194 filed Apr. 26, 2017, entitled "Substrate Manufacturing Method," the entire contents of which being herein incorporated by reference.

TECHNICAL FIELD

The present disclosure relates to a substrate manufacturing method optimum for manufacturing a thin magnesium oxide single crystal substrate.

BACKGROUND ART

A magnesium oxide single crystal substrate is used in the field of semiconductor, the field of display, the field of energy, and the like. In order to manufacture this magnesium oxide single crystal substrate, epitaxially growing this magnesium oxide single crystal substrate into a thin film shape is known as well as crystal-growing the magnesium oxide single crystal substrate into a bulk form and cutting the same into a substrate form (for example, refer to JP 2001-80996 A).

Meanwhile, it is thought that diamond is a semiconductor suitable for a high-frequency/high-output electronic device, and in vapor-phase synthesis as one of synthesis methods thereof, a magnesium oxide substrate or a silicon substrate is used as a base substrate (for example, refer to JP 2015-59069 A).

SUMMARY

Technical Problem

In recent years, as performance of a semiconductor device has been increased, a magnesium oxide single crystal substrate, which is thin and has less lattice defects, has been being required more and more.

A magnesium oxide substrate (MgO substrate) that is a base substrate in manufacture of the above diamond substrate is expensive, and for example, the magnesium oxide substrate is peeled off and separated while keeping a thickness thereof necessary as a base substrate after subjecting single crystal diamond to vapor-phase synthesis, whereby the magnesium oxide substrate becomes reusable as the base substrate. Specifically, for example, if a magnesium oxide substrate with a thickness of 180 μm is obtained and reused from a base substrate of magnesium oxide with a thickness of 200 μm, then it can be expected that significant cost reduction can be achieved in a manufacturing process of the diamond substrate, and that this achievement greatly contributes to cost reduction of the diamond substrate.

In view of the above problem, it is an object of the present disclosure to provide a substrate manufacturing method capable of easily obtaining the thin magnesium oxide single crystal substrate.

Solution To Problem

Incidentally, while a variety of manufacturing methods for obtaining a single crystal silicon substrate have been proposed, the inventor of the present disclosure found a manufacturing method, which is targeted for the magnesium oxide substrate and based on a new processing principle different from that of single crystal silicon, as a result of earnest study in the present disclosure.

In accordance with an aspect of the present disclosure for solving the above problems, provided is a substrate manufacturing method including: a first step of disposing a condenser for condensing a laser beam in a non-contact manner on a surface of a single crystal member of magnesium oxide to be irradiated; and a second step of irradiating a laser beam to a surface of the single crystal member and condensing the laser beam into an inner portion of the single crystal member under designated irradiation conditions using the condenser, and at a same time, two-dimensionally (X-Y plane) moving the condenser and the single crystal member relatively to each other, and sequentially forming processing marks in an inner portion of the single crystal member to sequentially allow planar peeling.

Moreover, in another aspect of the present disclosure, provided is a substrate manufacturing method including: a first step of disposing a condenser for condensing a laser beam in a non-contact manner on a surface of a single crystal member of magnesium oxide to be irradiated; a second step of irradiating a laser beam to a surface of the single crystal member and condensing the laser beam into an inner portion of the single crystal member under designated irradiation conditions using the condenser, and at a same time, two-dimensionally moving the condenser and the single crystal member relatively to each other, and sequentially forming processing marks to sequentially allow planar peeling; and a third step of irradiating a laser beam to a surface of the single crystal member and condensing the laser beam into the inner portion of the single crystal member under designated irradiation conditions using the condenser, and at a same time, two-dimensionally moving the condenser and the single crystal member relatively to each other, and sequentially irradiating the laser beam between adjacent irradiation lines when the laser beam is applied in the second step to sequentially allow planar peeling.

Effects

In accordance with the present disclosure, the substrate manufacturing method capable of easily obtaining the thin magnesium oxide single crystal substrate can be provided.

BRIEF DESCRIPTION OF DRAWINGS

FIG. 4 is an explanatory view showing laser beam application conditions in Example 2.

FIG. 13 is an explanatory view showing laser beam application conditions in Example 3.

FIG. 14 is a photograph view showing a wafer plane already irradiated with the laser beam in Example 3.

FIGS. 20A to 20C are schematic plan view and cross-sectional view explaining that the laser beam is applied and an explanatory view explaining the laser beam application conditions in Example 4, respectively.

FIG. 23 is an explanatory view explaining a state of the peeled surface by capturing the peeled surface while sequentially moving the captured position of the peeled surface in Example 4.

FIG. 31A is a schematic plan view explaining that the laser beam is applied while shifting an application position thereof in a second embodiment and Example 6, and FIG. 31B is a schematic substrate cross-sectional view explaining that a modified layer is formed by the irradiation in the second embodiment and Example 6.

FIG. 32 is an explanatory view explaining laser beam application conditions in Example 6.

DESCRIPTION OF EMBODIMENTS

Figure 1A:
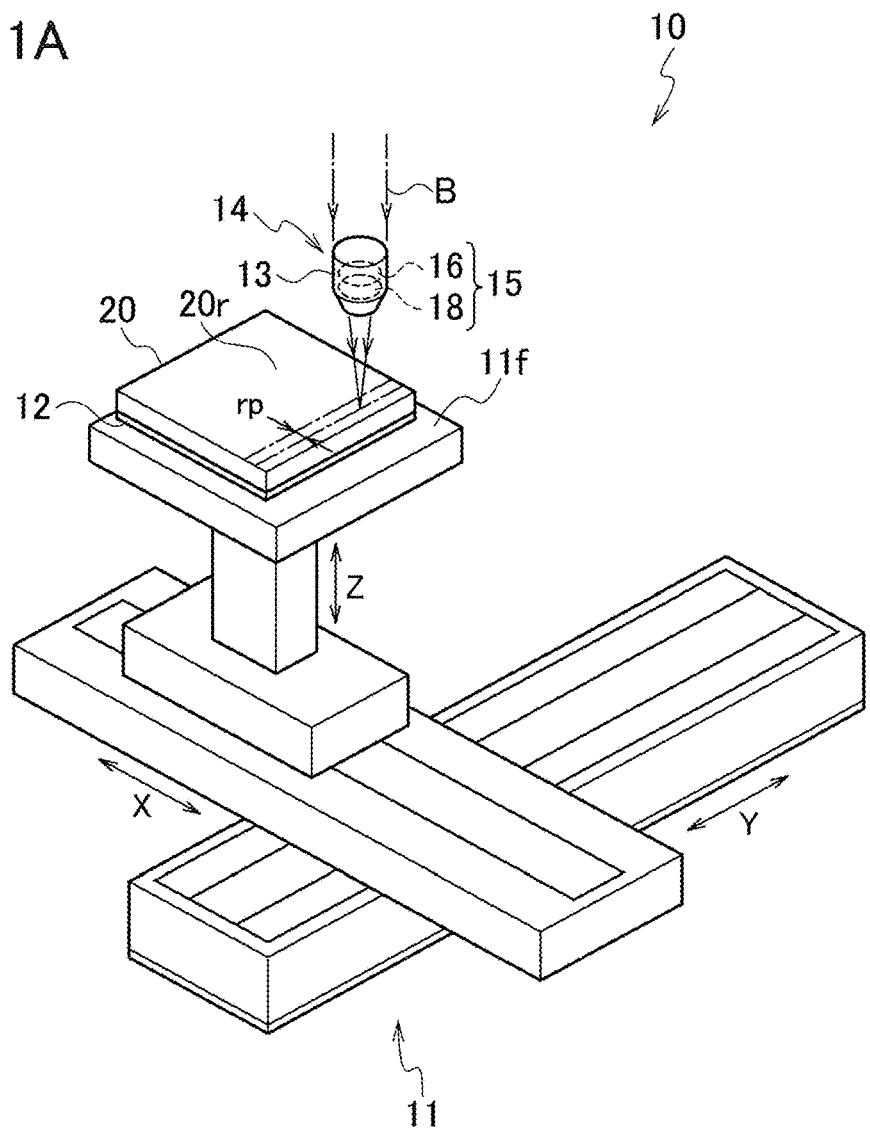
FIG. 1A is a schematic perspective view of a peeled substrate manufacturing apparatus for use in an embodiment of the present disclosure.

Hereinafter, a description will be given of embodiments of the present disclosure with reference to the accompanying drawings. In the following description, the same or similar reference numerals are assigned to the same constituents as or similar constituents to those already described, and a detailed description thereof is omitted as appropriate. Moreover, the embodiments shown below are exemplifications for embodying the technical idea of this disclosure, and the embodiments of this disclosure do not specify materials, shapes, structures, dispositions and the like of constituent components to those described below. The embodiments of this disclosure can be implemented while being changed in various ways within the scope without departing from the spirit.

First Embodiment

First, a first embodiment will be described. In this embodiment, a peeled substrate is obtained from a single crystal substrate (single crystal member) using a peeled substrate manufacturing apparatus 10 (refer to FIGS. 1A and 1B).

The peeled substrate manufacturing apparatus 10 includes: an XY stage 11; a substrate mounting member 12 (for example, silicon wafer) held on a stage surface 11$f$ of the XY stage 11; and a condenser 14 for condensing a laser beam B toward a magnesium oxide single crystal substrate 20 mounted on the substrate mounting member 12. Note that, in FIG. 1A, the magnesium oxide single crystal substrate 20 is drawn into a rectangular shape when viewed from above; however, it may have a wafer shape as a matter of course, and a shape of the magnesium oxide single crystal substrate 20 can be selected freely.

The XY stage 11 is configured to be capable of adjusting a height position (Z-axis direction position) of the stage surface 11$f$, in which a distance L between the stage surface 11$f$ and the condenser 14 is made adjustable, that is, a distance between the single crystal substrate on the stage surface 11$f$ and the condenser 14 is made adjustable. The XY stage 11 is also configured to be capable of adjusting positions in the X-Y plane.

Figure 1B:
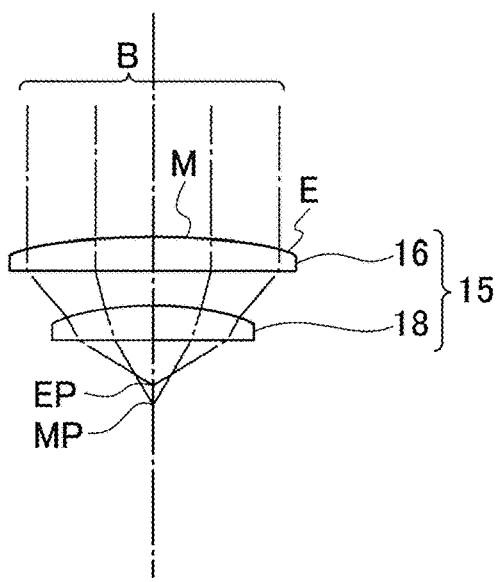
FIG. 1B is a partially enlarged side view of the peeled substrate manufacturing apparatus for use in the embodiment of the present disclosure.

In this embodiment, the condenser 14 includes: a correction ring 13; and a condenser lens 15 held in the correction ring 13. The condenser 14 has a function to correct an aberration allowed by a refractive index of the single crystal substrate 20 made of magnesium oxide, that is, a function as an aberration correction ring. Specifically, as shown in FIG. 1B, when condensing the laser beam B in the air, the condenser lens 15 corrects the laser beam B so that such a laser beam B that has reached an outer peripheral portion E of the condenser lens 15 is condensed closer to the condenser lens 15 than such a laser beam B that has reached a center portion M of the condenser lens 15 is. That is, in the case of the beam condensation, the laser beam B is corrected so that a condensing point EP of the laser beam B that has reached the outer peripheral portion E of the condenser lens 15 is located at a position closer to the condenser lens 15 than a condensing point MP of the laser beam B that has reached the center portion M of the condenser lens 15 is.

This condenser lens 15 is composed of: a first lens 16 that condenses the laser beam B in the air; and a second lens 18 disposed between this first lens 16 and the single crystal substrate 20. In this embodiment, each of the first lens 16 and the second lens 18 is defined as a lens capable of condensing the laser beam B in a conical shape. Then, a rotational position of the correction ring 13 is adjusted, that is, an interval between the first lens 16 and the second lens 18 is adjusted, whereby it is made possible to adjust an interval between the condensing point EP and the condensing point MP. The condenser 14 has a function as a correction ring-attached lens.

As the first lens 16, besides a spherical or aspherical single lens, a set of lens is usable for the purpose of a variety of aberration corrections and of ensuring a working distance.

Substrate Manufacturing Method

Hereinafter, a description will be given of an example of manufacturing the magnesium oxide single crystal substrate that is thin from the magnesium oxide single crystal substrate with reference to the accompanying drawings.

In this embodiment, performed is a first step of disposing the condenser 14 in a non-contact manner above an irradiated surface 20r of the magnesium oxide single crystal substrate 20 with less lattice defects (hereinafter, simply referred to as a single crystal substrate 20). Note that, though not shown, in the case of peeling off the magnesium oxide substrate while leaving such a thin substrate of the magnesium oxide substrate in the diamond substrate formed using the magnesium oxide substrate as a base substrate, the laser may be applied from the magnesium oxide substrate side.

Figure 10:
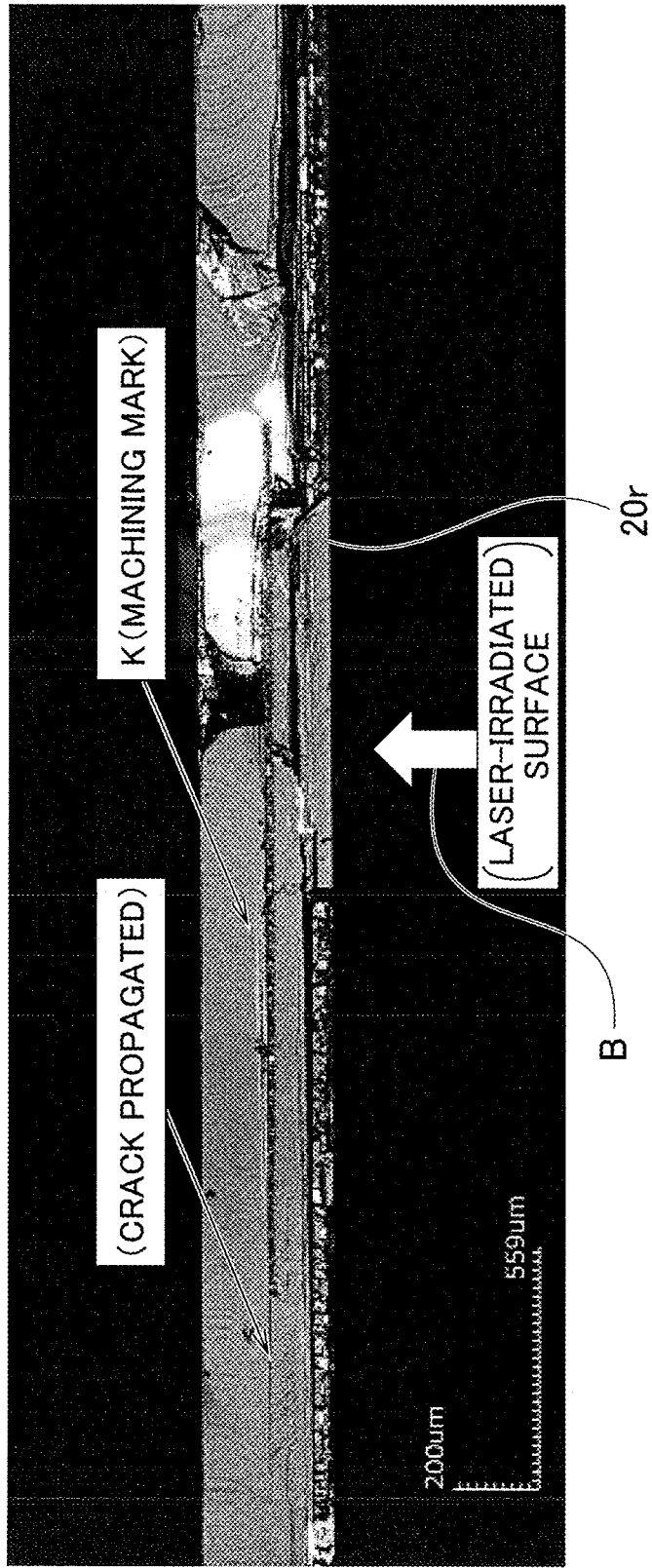
FIG. 10 is a captured image view showing a test piece cross section already irradiated with the laser beam in Example 2.

Then, performed is a second step of irradiating the laser beam B to the surface of the single crystal substrate 20 and condensing the laser beam B into an inner portion of the single crystal substrate 20 under designated irradiation conditions using the condenser 14, and at the same time, two-dimensionally moving the condenser 14 and the single crystal substrate 20 relatively to each other, thereby sequentially forming processing marks (for example, refer to FIG. 10) in the inner portion of the single crystal substrate 20, thereby sequentially causing planar peeling.

In this second step, in consideration of a thickness of a peeled substrate 20p (refer to FIG. 2) manufactured by the planar peeling described above, a relative distance between the condenser 14 and the single crystal substrate 20 is preset so that the laser beam B is focused at a designated height position, that is, so that the laser beam B is focused at a designated depth position from the irradiated surface 20r of the single crystal substrate 20.

In this embodiment, the processing marks K are sequentially formed, whereby the planar peeling occurs naturally, and the peeled substrate 20p is formed on the irradiated surface. The designated irradiation conditions of the laser beam B are preset so that the planar peeling occurs naturally as described above. In this setting of the designated irradiation conditions, in consideration of properties (crystal structure or the like) of the single crystal substrate 20, the thickness t of the peeled substrate 20p to be formed (refer to FIG. 2), an energy density of the laser beam B at a focal point, and the like, set are a variety of values such as a wavelength of the laser beam B to be applied, an aberration correction amount (defocus amount) of the condenser lens 15, a laser output, a dot pitch dp of the processing mark K (refer to FIG. 2; an interval between adjacent processing marks in the same processing mark line, that is, an interval between a processing mark and a processing mark formed immediately therebefore), and a line pitch rp (refer to FIG. 1A; an offset pitch: an interval between adjacent processing mark lines). The obtained peeled substrate 20p is thereafter subjected to post treatment such as polishing of the peeled surface according to needs. Note that, in this description, the planar peeling is a concept including a state in which the peeled substrate will be peeled off by receiving slight force even if the peeled substrate is not actually peeled off.

In accordance with this embodiment, the thin magnesium oxide single crystal substrate can be obtained easily.

Moreover, in this embodiment, it is desirable to use a high brightness laser beam as the laser beam B. In the present disclosure, the high brightness laser beam is specified by peak power and a power density that is power per unit area in energy per unit time. A laser with a short pulse width is preferable in order to further increase the power density.

Moreover, in this embodiment, it is possible to implement the aberration correction by the correction ring 13 and the condenser lens 15, which are held by the condenser 14, and in the second step, the defocus amount can be set by the aberration correction. In this way, a range of the designated irradiation conditions described above can be greatly widened. When it is possible to select mechanism for adjusting a depth of forming the processing marks and conditions for thinly forming the processing marks depending on a thickness of such a substrate to be machined and a thickness of such a substrate to be peeled off, and the thickness of the magnesium oxide substrate to be machined is 200 to 300 μm, then the above range of the designated irradiation condition can be widened effectively by setting the defocus amount to 30 to 120 μm.

Second Embodiment

Next, a second embodiment will be described. In comparison with the first embodiment, the laser beam is applied in two stages in this embodiment (refer to FIGS. 31A and 31B).

In a similar way to the first embodiment, in this embodiment, first, performed is a first step of disposing the condenser 14 in a non-contact manner on the irradiated surface 20r of the single crystal substrate 20 (magnesium oxide single crystal substrate).

Then, a second step is performed. In this second step, the laser beam B is applied to the surface of the single crystal substrate 20 and the laser beam is condensed into the inner portion of the single crystal substrate 20 under designated irradiation conditions using the condenser 14, and at the same time, the condenser 14 and the single crystal substrate 20 are two-dimensionally moved relatively to each other, whereby the processing marks are sequentially formed in the inner portion of the single crystal substrate 20.

Then, a third step is performed. In this third step, the laser beam is applied to the surface of the single crystal substrate 20 and the laser beam B is condensed into the inner portion of the single crystal substrate 20 under designated irradiation conditions using the condenser 14, and at the same time, the condenser 14 and the single crystal substrate 20 are two-dimensionally moved relatively to each other, whereby the planar peeling is sequentially allowed by sequentially irradiating the laser beam between adjacent irradiation lines R1 when the laser beam is applied in the second step.

The designated irradiation conditions at the second irradiation (third step) may or may not be the same as those in the first irradiation (second step).

In comparison with the first embodiment, in accordance with this embodiment, it can be made easier to allow the peeling that is uniform and good over the entire surface.

Note that, in the third step, if the laser beam is sequentially applied to intermediate positions between the adjacent irradiation lines R1, then it is easy to allow the uniform peeling efficiently.

Moreover, the designated irradiation conditions in the second step and the designated irradiation conditions in the third step may be determined in advance so that, in the second step and the third step, a modified layer 32 (refer to FIG. 31B) in which the processing marks are arrayed in a planar shape is formed, and in the third step, in the case of sequentially causing the planar peeling, uniform processing mark separated portions Kp formed by separating the processing marks from one another are arrayed and formed on a peeled surface of the modified layer 32, which is remote from an irradiated side thereof. In this way, it is far more easier to allow the peeling that is uniform and good over the entire surface.

Example 1

The inventor of the present disclosure used the peeled substrate manufacturing apparatus 10 described in the above embodiments, held a silicon wafer as the substrate mounting member 12 on the stage surface 11f of the XY stage 11, and mounted and held a single crystal magnesium oxide wafer 20u (hereinafter, simply referred to as a wafer 20u) as the single crystal substrate 20 on this silicon wafer.

Then, by the substrate manufacturing method described in the above embodiment, in order to sequentially form the processing marks K in an inner portion of each of irradiation experiment regions of the wafer 20u, the laser beam B was applied to each irradiation experiment region of the wafer 20u from the irradiated surface thereof, and at the same time, the condenser 14 and the wafer 20u were two-dimensionally (in a plane form) moved relatively to each other.

Figures 2, 3:
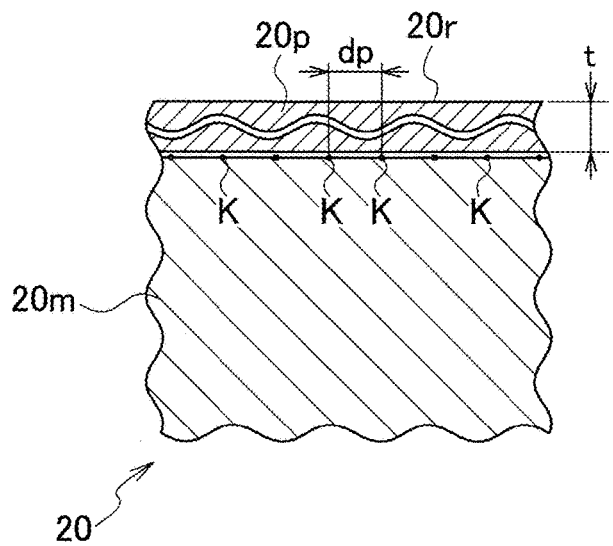
FIG. 2 is a schematic side cross-sectional view explaining that a peeled substrate is peeled off from a magnesium oxide single crystal substrate in the embodiment of the present disclosure.
FIG. 3 is an explanatory view showing laser beam application conditions in Example 1.
Figure 5:
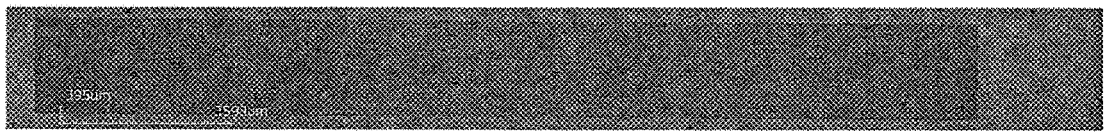
FIG. 5 is a captured image view showing a test piece plane already irradiated with a laser beam in Example 2.
Figure 6:
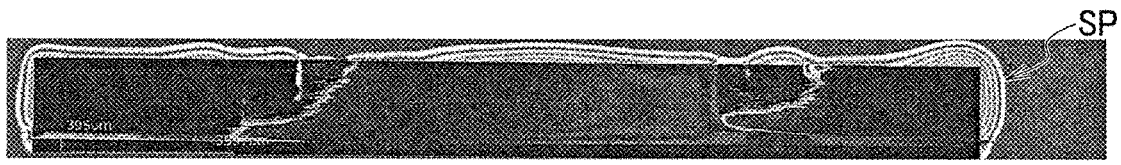
FIG. 6 is a captured image view showing a test piece plane already irradiated with a laser beam in Example 2.
Figure 7:
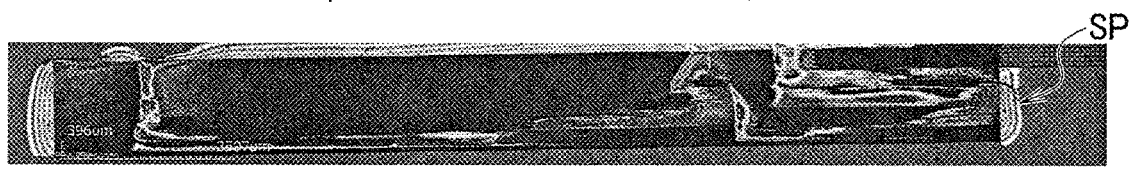
FIG. 7 is a captured image view showing a test piece plane already irradiated with a laser beam in Example 2.
Figure 8:
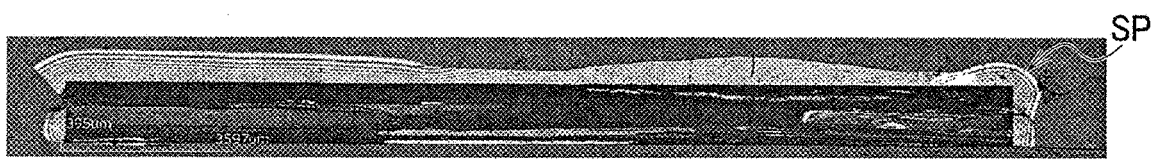
FIG. 8 is a captured image view showing a test piece plane already irradiated with a laser beam in Example 2.
Figure 9:
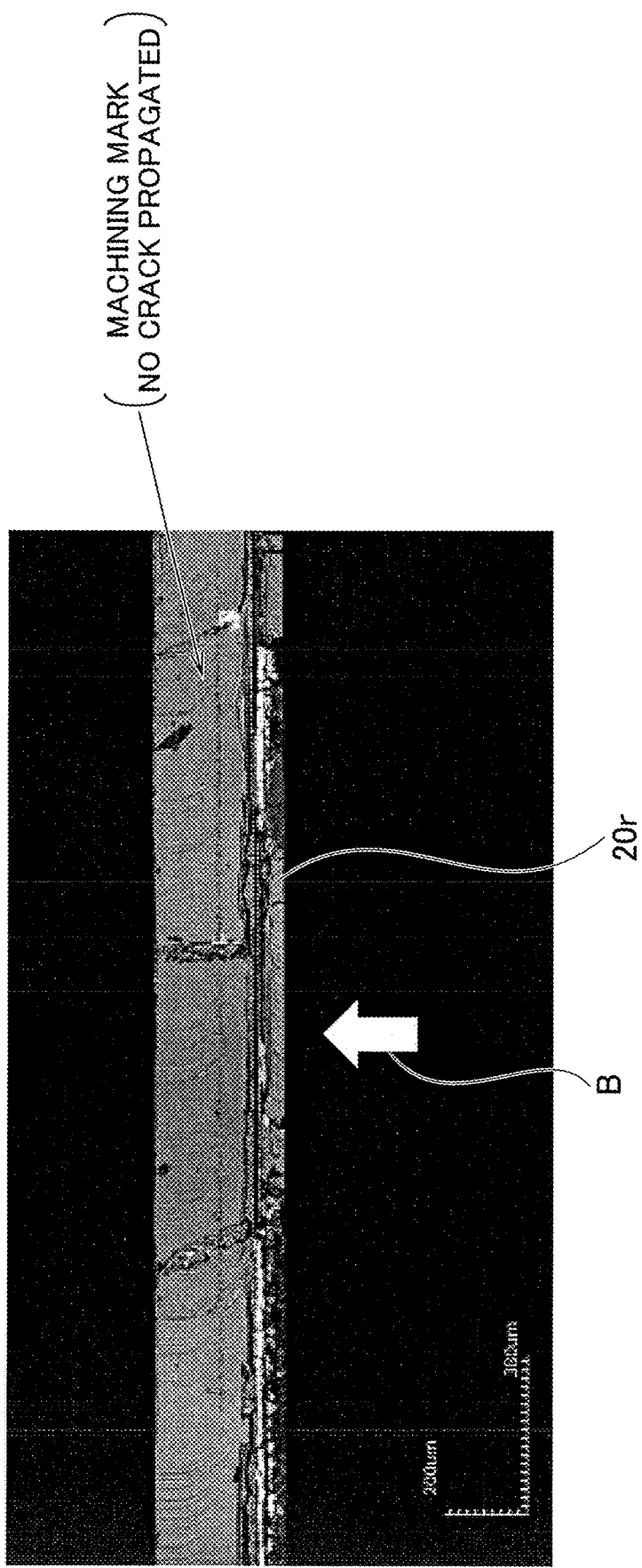
FIG. 9 is a captured image view showing a test piece cross section already irradiated with the laser beam in Example 2.

In this example, the laser beam was applied in a line form (linearly), whereby one processing mark was formed, another processing mark was formed in parallel to this processing mark at a position apart therefrom at a designated amount of offset interval, and still another processing mark was further formed in a similar way at the designated amount of offset interval. Moreover, in this example, the irradiation test of the laser beam B was carried out for each of cases where the wavelength of the laser beam B was 1064 nm, 532 nm and 1024 nm. Irradiation conditions are shown in FIG. 3.

As a result of observing the irradiated surface by an electron microscope after the irradiation, at 1064 nm, the laser beam B did not enter the wafer 20u much, and aberration occurred on the surface of the wafer. At 532 nm, the laser beam B entered the wafer 20u, and the processing marks were formed in the inner portion of the wafer; however, the processing marks were not very good since the irradiation energy was too strong. At 1024 nm, the laser beam B entered the wafer 20u, the processing marks were formed in the inner portion of the wafer, and the processing marks were relatively good.

Example 2

In a similar way to Example 1, the inventor of the present disclosure used the peeled substrate manufacturing apparatus 10 described in the above embodiments, held a silicon wafer on the stage surface 11f of the XY stage 11, and mounted and held the wafer 20u (single crystal magnesium oxide wafer: crystal orientation 100, diameter 50.8 mm, thickness 300 μm) as the single crystal substrate 20 on this silicon wafer.

Figure 11:
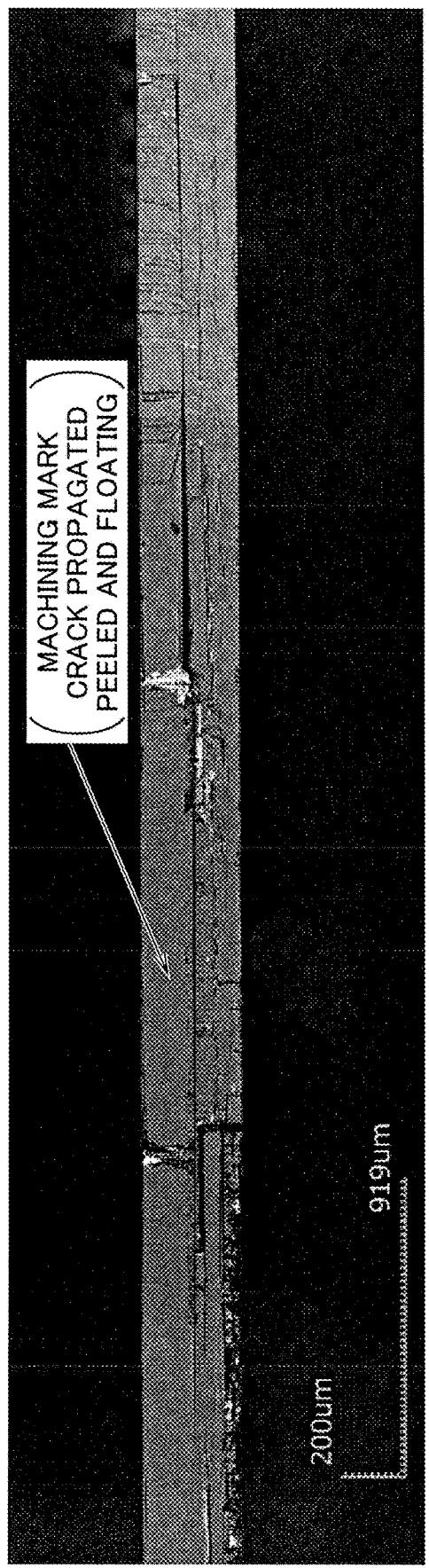
FIG. 11 is a captured image view showing a test piece cross section already irradiated with the laser beam in Example 2.
Figure 12:
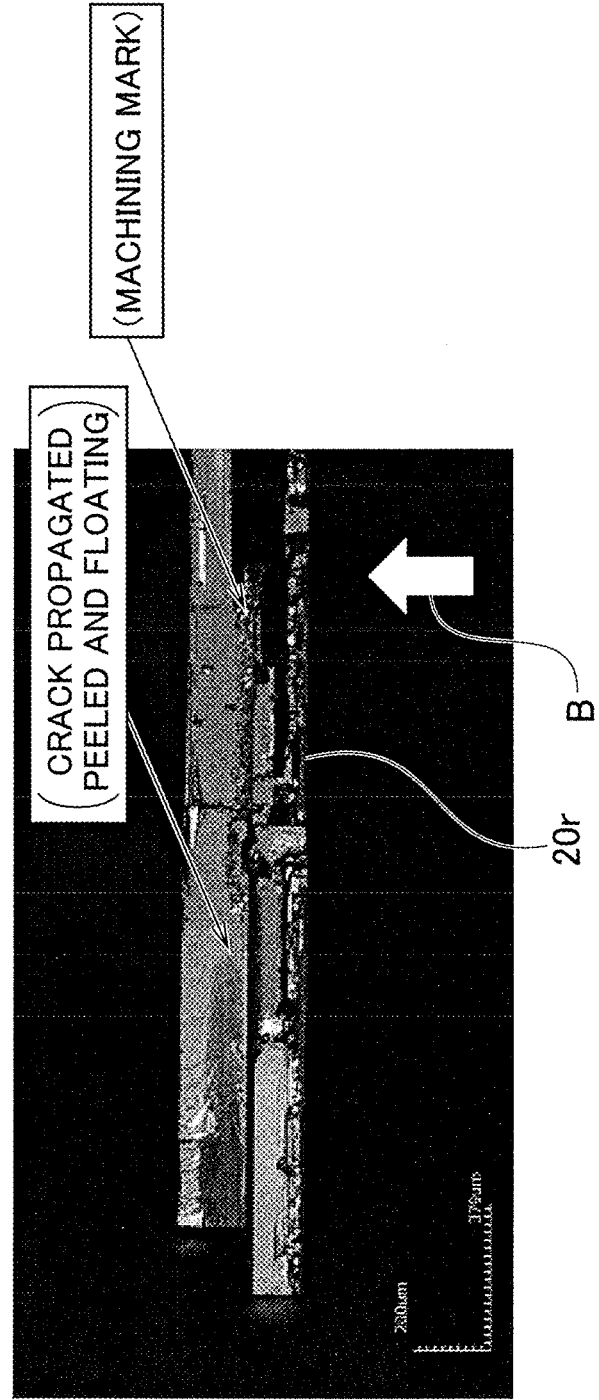
FIG. 12 is a captured image view showing a test piece cross section already irradiated with the laser beam in Example 2.

Then, the laser beam B was applied to each irradiation experiment region of the wafer 20u, and at the same time, the condenser 14 and the wafer 20u were moved relatively to each other in a plane form (two-dimensionally), whereby the processing marks K (for example, refer to FIG. 11) were sequentially formed in the inner portion of each irradiation experiment region. While three processing marks were formed in Example 1, 100 processing marks were formed in this example. Irradiation conditions are shown in FIG. 4.

In this example, the wavelength of the laser beam B to be applied was set to 1024 nm based on the result of Example 1. Moreover, a defocus amount (DF) was set to 0.05 mm, and the processing marks K were formed in a line form (linearly) on a substantially intermediate position in a thickness direction of the wafer 20u. At this time, the laser output was changed as a parameter, and the laser beam B was individually applied at 0.1 W, 0.3 W, 0.5 W and 1.0 W. Plan captured image views of the respective test pieces already irradiated are shown in FIG. 5 to FIG. 8. Note that, in each of FIG. 6 to FIG. 8, generation of a stripe pattern SP (rainbow pattern) on the front surface of the test piece suggests that the surface of the test piece is deformed since a crack propagates in the inner portion of the test piece.

Thereafter, in order to investigate a generation state of the crack due to the processing marks K, the test piece was cleaved for each irradiation experiment region so that the processing mark K was exposed, and a side cross section thereof was observed. Side cross section captured image views of the respective test pieces are shown in FIG. 9 to FIG. 12. Note that generation of the stripe pattern SP (rainbow pattern) on the front surface of each test piece suggests that the surface of the test piece is deformed since the crack propagates in the inner portion of the test piece.

At 0.1 W of the laser output, the processing marks K were formed in the inner portion of the test piece; however, the propagation of the crack did not occur. At 0.3 W of the laser output, the processing marks K were formed in the inner portion of the test piece, and the propagation of the crack also occurred; however, peeling in such a propagated portion of the crack was not observed. At 0.5 W of the laser output, the processing marks K were formed in the inner portion of the test piece, the propagation of the crack also occurred, and the peeling in the propagated portion of the crack was observed. At 1.0 W of the laser output, the processing marks K were formed in the inner portion of the test piece, the propagation of the crack also occurred, the peeling in the propagated portion of the crack was observed, and a damage on the peeled surface was also observed since the irradiation energy was too strong.

Example 3

The inventor of the present disclosure carried out this example by setting the laser output to 0.5 W based on the results of Example 2.

In a similar way to Example 2, the inventor of the present disclosure used the peeled substrate manufacturing apparatus 10 described in the above embodiments, held a silicon wafer on the stage surface 11f of the XY stage 11, and mounted and held the wafer 20u (single crystal magnesium oxide wafer) as the single crystal substrate 20 on this silicon wafer.

Then, the condenser 14 and the wafer 20u were moved in a planar shape (two-dimensionally) relatively to each other, whereby the laser beam B was applied in a planar shape to the wafer 20u, and processing mark lines were formed. Irradiation conditions are shown in FIG. 13.

In this example, when the laser beam B was applied, the line pitch rp was changed as a parameter, and the laser beam B was individually applied to irradiated regions 20a to 20c (refer to FIG. 14) so that the line pitch rp became 10 μm, 20 μm and 50 μm, respectively.

Figure 15:
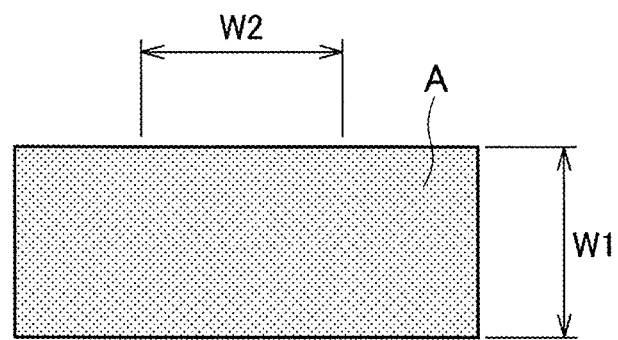
FIG. 15 is a schematic plan view explaining a region cleaved from a wafer already irradiated with the laser beam in Example 3.

Then, each of the irradiated regions was cleaved to be used as such a test piece. In this cleavage, each of the irradiated regions of the wafer 20u was cleaved using a glass cutter so that an elongated member (corresponding to a member shown as a dot-hatched region A in FIG. 15) with a short width of W1, which was elongated in a direction along an orientation flat, was formed. Moreover, both end portions in a longitudinal direction of each of the elongated members were cut off so that a center portion with a width of W2, which composed a center portion in the longitudinal direction in the elongated member, was left. In this way, final test pieces were obtained.

At the line pitch rp of 50 natural peeling did not occur from the irradiated surface even if the irradiated regions were cleaved into the elongated members. Note that, in this description, the natural peeling from the irradiated surface of the substrate means that a peeled substrate is obtained by two-dimensional peeling on the irradiated surface of the substrate even if force is not applied thereto.

Figure 16:
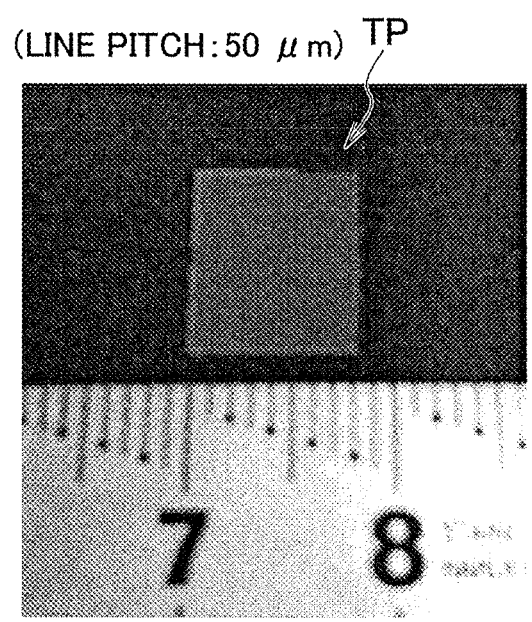
FIG. 16 is a photograph view showing an additionally cleaved member obtained by cleaving and further additionally cleaving the wafer already irradiated with the laser beam in Example 3.

Then, the elongated member was further cleaved to obtain a final test piece TP (refer to FIG. 16). Even in this final test piece TP, the natural peeling did not occur from the irradiated surface.

Figure 17:
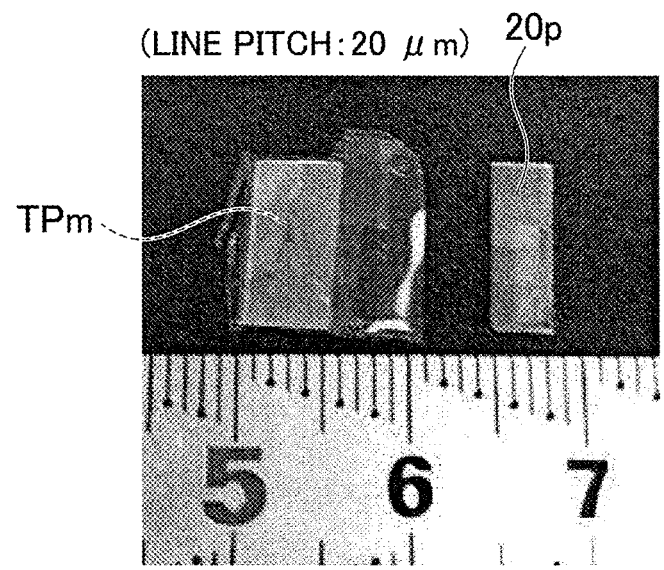
FIG. 17 is a photograph view of an elongated member obtained by cleaving the wafer already irradiated with the laser beam in Example 3.

At the line pitch rp of 20 μm, when a final test piece was obtained by cleavage, then as shown in FIG. 17, it was seen that the peeled substrate 20p was naturally peeled in a half region of the irradiated surface 20r (that is, a half region of the region A), and that the natural peeling occurred in the half region of the irradiated surface 20r. Then, in a region as other half, it was confirmed that the peeled substrate 20p was perfectly peeled from an elongated member body 20m (refer to FIG. 2) though the natural peeling did not occur therein. Note that FIG. 17 shows the peeled substrate 20p naturally peeled in the half region of the irradiated surface 20r and a remaining test piece TPm covered with a protective film.

Figure 18:
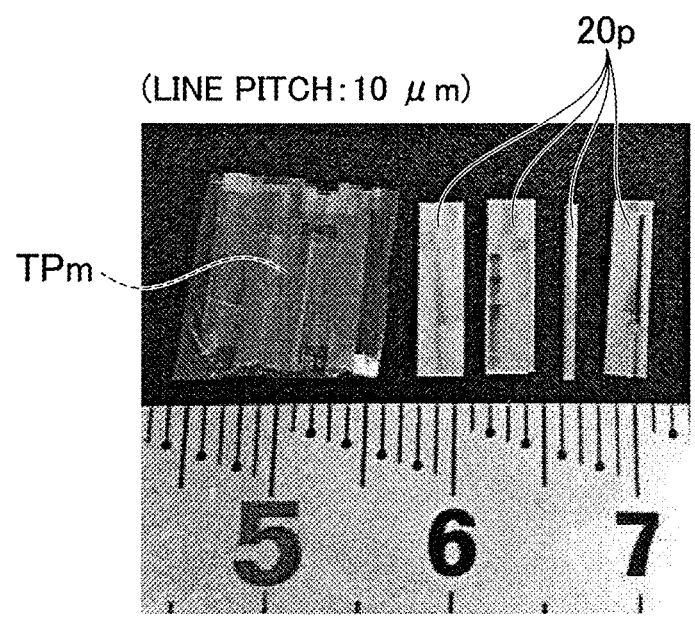
FIG. 18 is a photograph view of the elongated member obtained by cleaving the wafer already irradiated with the laser beam in Example 3.

At the line pitch rp of 10 μm, when final test pieces were obtained by cleavage, then as shown in FIG. 18, over the entire region of the irradiated surface 20r (entire region of the region A), the peeled substrate was naturally cleaved, and was peeled off from the elongated member body 20m (refer to FIG. 2). Hence, it was confirmed that such peeled substrates 20p were perfectly peeled off from the elongated member body 20m. Note that FIG. 18 shows such peeled substrates 20p naturally peeled as a result of natural cleavage from the entire region of the irradiated surface 20r and a remaining test piece TPm covered with a protective film.

Example 4

Figure 19:
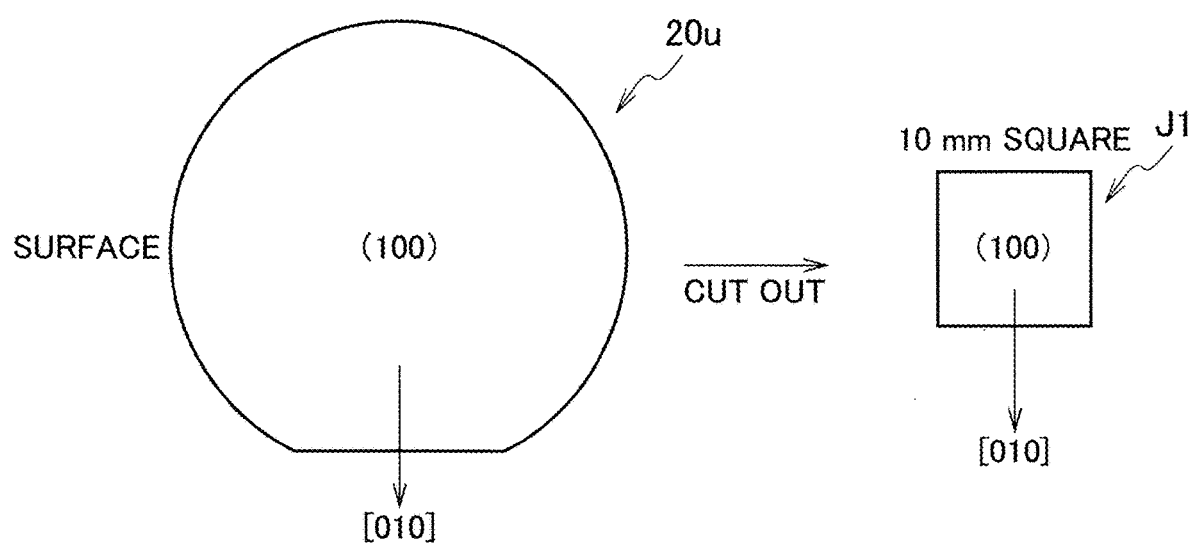
FIG. 19 is an explanatory view explaining that a test piece is cut out of a single crystal magnesium oxide wafer in Example 4.

As shown in FIG. 19, the inventor of the present disclosure cut a single crystal magnesium oxide substrate having a square shape of 10 mm×10 mm when viewed from above (hereinafter, referred to as a test piece J1) out of the single crystal magnesium oxide wafer 20u having a diameter of 2 inches and a thickness of 300 μm. Note that, as shown in FIG. 19, an experiment was carried out while making crystal orientations (100, 010 and the like) to correspond between the single crystal magnesium oxide wafer 20u and the test piece J1. Note that a direction where the cleavage is easy to occur is the crystal orientation 100 (plane orientation 100).

(1) Irradiation Conditions

In this example, the peeled substrate manufacturing apparatus 10 described in the above embodiments was used, and as shown in FIG. 20A, at designated depth positions of the test piece J1, processing marks 22c were formed at a designated dot pitch dp and a designated line pitch rp, whereby planar modified layers 22 were formed in an inner portion of this test piece J1. FIG. 20B shows a schematic cross-sectional view of the test piece J1 in which the processing marks 22c are formed, and FIG. 20C shows laser beam application conditions.

(2) Peeled Surface

After being irradiated with the laser beam, the irradiated surface (upper side) of the test piece J1 was sandwiched by aluminum-made bases 24u and 24b via an adhesive. Both of the bases 24u and 24b are made of aluminum. As the adhesive, an epoxy adhesive was used, the base 24u was adhered to the irradiated surface (upper side) of the test piece J1, and the base 24b was adhered to a bottom surface side (lower side) of the test piece J1.

Then, these bases 24u and 24b are pulled in the vertical direction, whereby peeling force thereof from the modified layer 22 was measured, and a tensile rupture stress was calculated, which was necessary to separate, from the modified layer 22, an upper test piece J1u having the irradiated surface (upper side) of the test piece J1 and a lower test piece J1b having a bottom surface (lower side) of the test piece J1. As a result, the upper test pieces J1u and the lower test pieces J1b were able to be separated by a tensile tress of 0.3 MPa. Hence, the upper test pieces J1u and the lower test pieces J1b were able to be separated from the modified layer 22 by the tensile rupture stress that was much smaller than 12 MPa as a tensile rupture stress of the single crystal silicon substrate.

Figure 21:
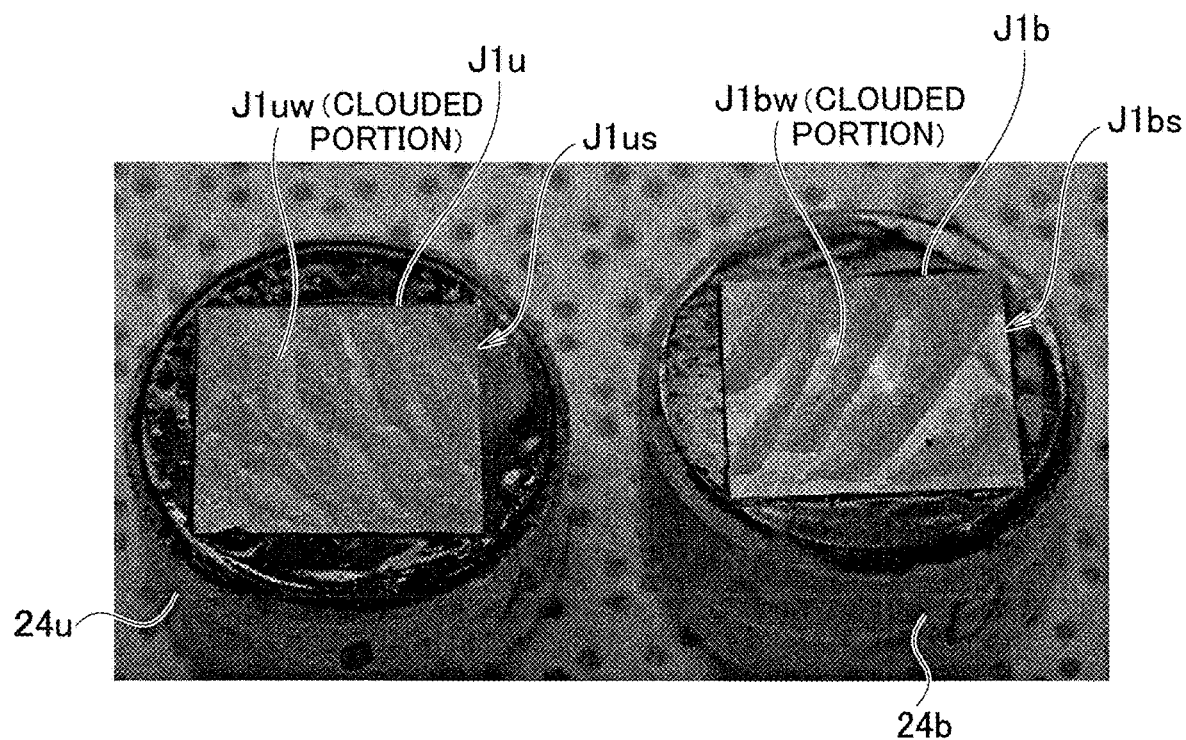
FIG. 21 is a photograph view showing peeled surfaces of test pieces in Example 4.

Then, the inventor of the present disclosure was able to observe, by the naked eye, that a stripe pattern was generated in each of a peeled surface J1us of the upper test piece J1u and a peeled surface J1bs of the lower test piece J1b (refer to FIG. 21).

Figure 22:
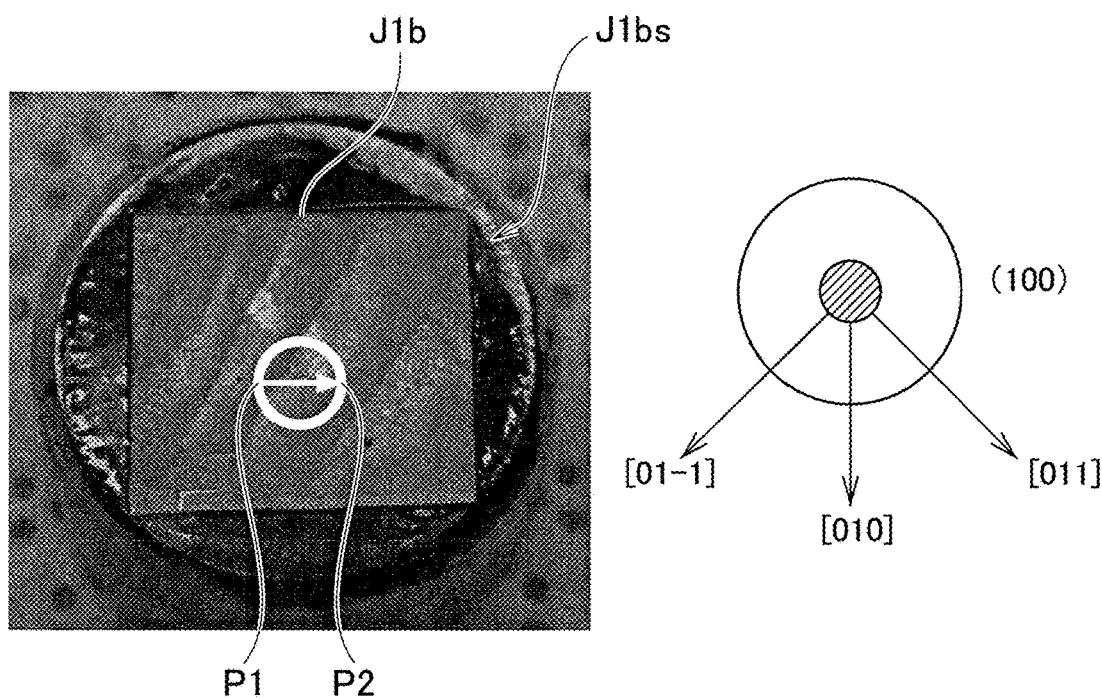
FIG. 22 is an explanatory view explaining that a captured position of the peeled surface is sequentially moved in Example 4.

Then, the peeled surface J1bs of the lower test piece J1b was captured by a SEM (scanning electron microscope) while sequentially shifting capturing positions from a point P1 shown in FIG. 22 to a point P2 shown in FIG. 22. Capturing results are shown in FIG. 23. Note that, in the captured image views attached to this description, crystal orientations are also shown as appropriate.

On the peeled surface J1bs, such a cyclic pattern J1bp was formed, in which a clouded portion J1bw, a transparent portion (smooth portion) J1bt and an interference portion J1bi appeared sequentially. Here, the clouded portion J1bw extended in a direction of the crystal orientation 011, and a direction of continuation in the cyclic pattern J1bp was a direction of the crystal orientation 01-1. Moreover, a large step difference BB (approximately 16 μm) was formed on the clouded portion J1bw, and a smooth surface F was formed on the transparent portion (smooth portion) J1bt.

Figure 24:
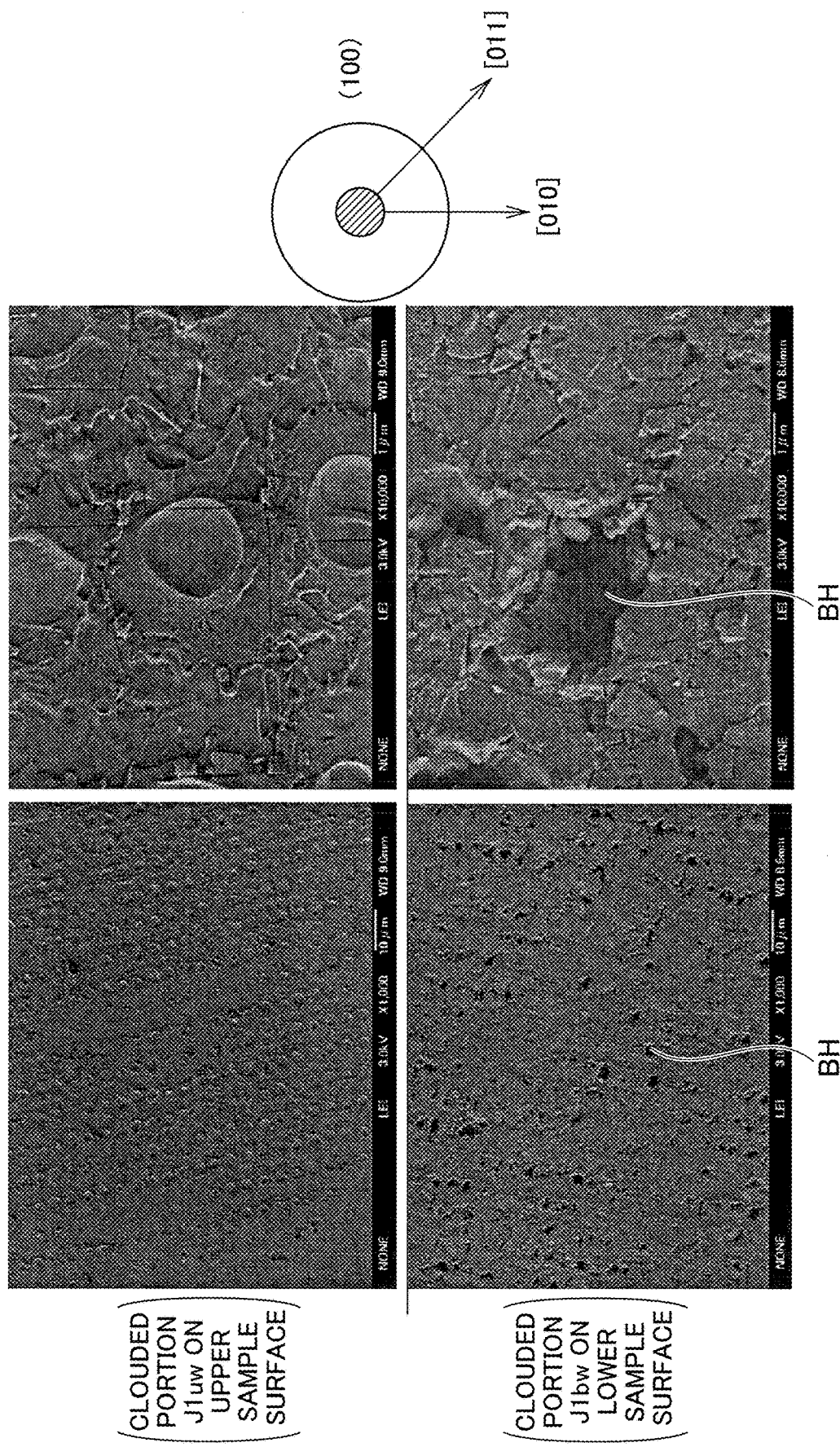
FIG. 24 is a captured image view obtained by capturing a clouded portion of the peeled surface in Example 4.

Moreover, the inventor of the present disclosure increased a magnification of the SEM, and captured a clouded portion J1uw of the peeled surface J1us of the upper test piece J1u and a clouded portion J1bw of the peeled surface J1bs of the lower test piece J1b. Capturing results are shown in FIG. 24. Crystal orientations in FIG. 24 are the same as the crystal orientations shown in FIG. 23.

Moreover, the inventor of the present disclosure captured a transparent portion (smooth portion) J1ut of the peeled surface J1us of the upper test piece J1u and a transparent portion (smooth portion) J1bt of the peeled surface J1bs of the lower test piece J1b. Capturing results are shown in FIG. 25.

Moreover, the inventor of the present disclosure captured an interference portion J1ui of the peeled surface J1us of the upper test piece J1u and an interference portion J1bi of the peeled surface J1bs of the lower test piece J1b. Capturing results are shown in FIG. 26. Crystal orientations in FIG. 26 are the same as the crystal orientations shown in FIG. 25.

Figure 25:
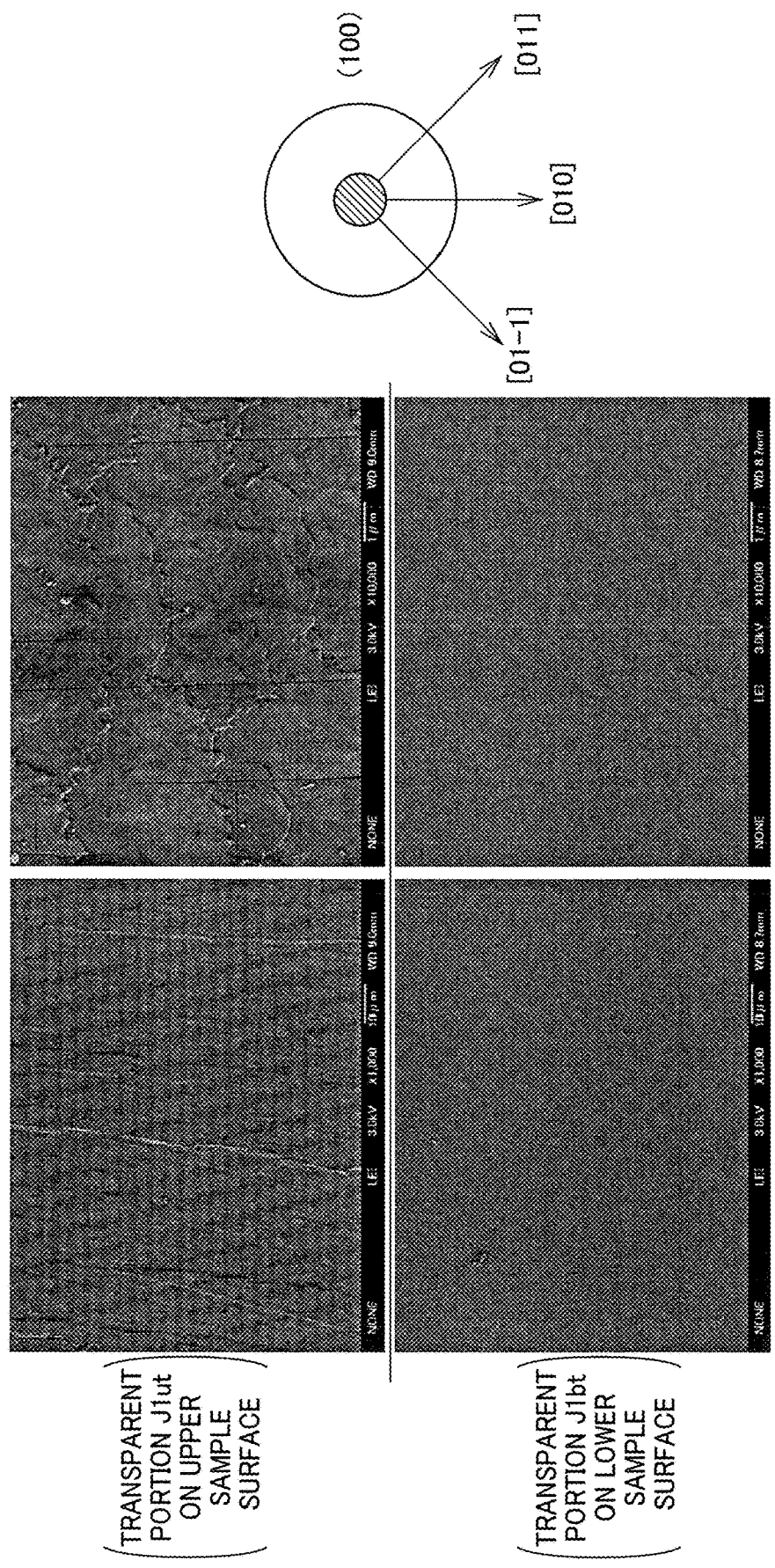
FIG. 25 is a captured image view obtained by capturing a transparent portion of the peeled surface in Example 4.
Figure 26:
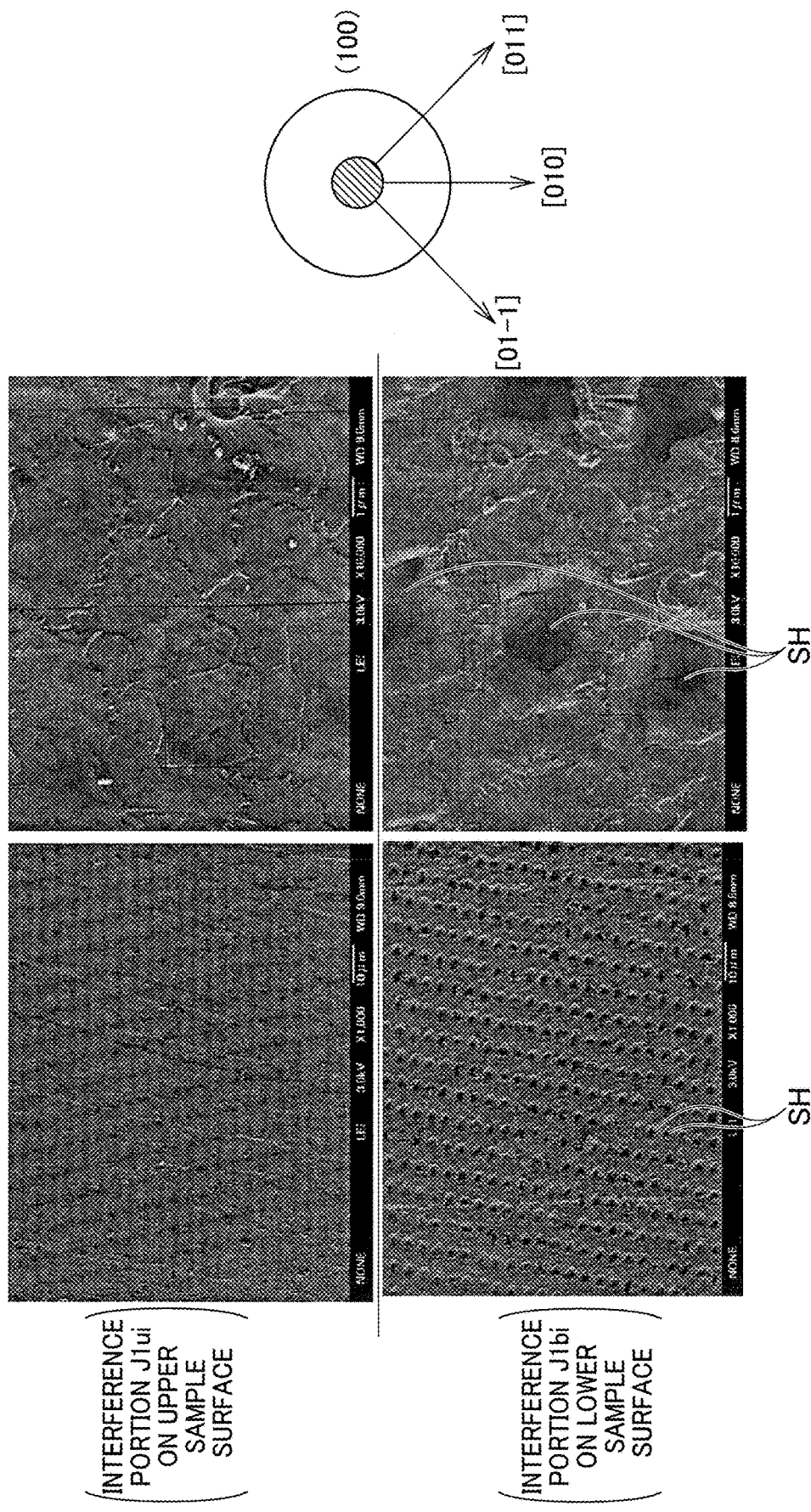
FIG. 26 is a captured image view obtained by capturing an interference portion of the peeled surface in Example 4.

In FIG. 24 to FIG. 26, the inventor of the present disclosure captured each of the peeled surface J1us of the upper test piece J1u and the peeled surface J1bs of the lower test piece J1b at both magnifications of 1000 times and 10000 times.

With regard to the peeled surface J1bs of the lower test piece J1b, in the clouded portion J1bw, as shown in FIG. 24, large hole portions BH were formed irregularly, and portions around the hole portions BH were formed into a rough irregular shape. In the transparent portion J1bt, as shown in FIG. 25, a flat surface was formed, and no hole portions were formed. In the interference portion J1bi, substantially uniform hole portions SH were arrayed regularly. A dimension of the hole portions SH was much smaller than that of the hole portions BH. Moreover, traces of melting were observed in regions other than the hole portions SH.

Figure 27:
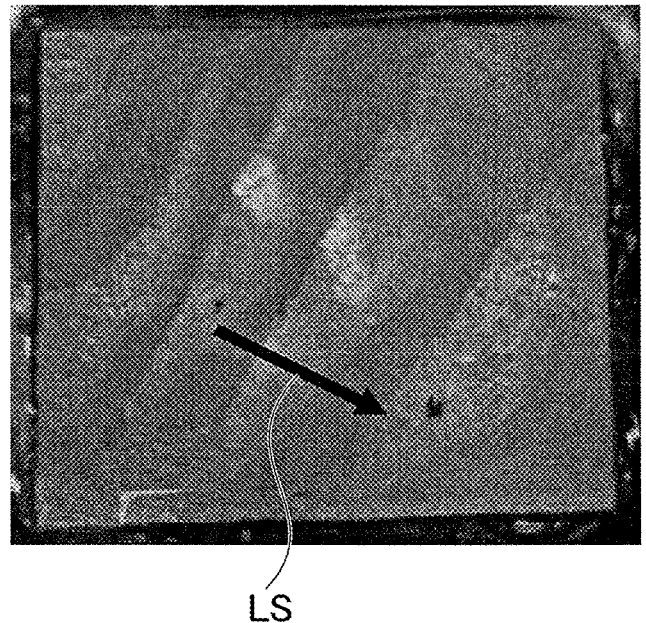
FIG. 27 is an explanatory view explaining a measurement position of a surface height of the peeled surface in Example 4.

Moreover, as shown in FIG. 27, for the peeled surface J1bs of the lower test piece J1b, the inventor of the present disclosure measured a height change in a line region LS, which is linear when viewed from above and ranges from the clouded portion J1bw via the transparent portion J1bt to the interference portion J1bi, by a surface roughness meter. Capturing results are shown in FIG. 28.

Figure 28:
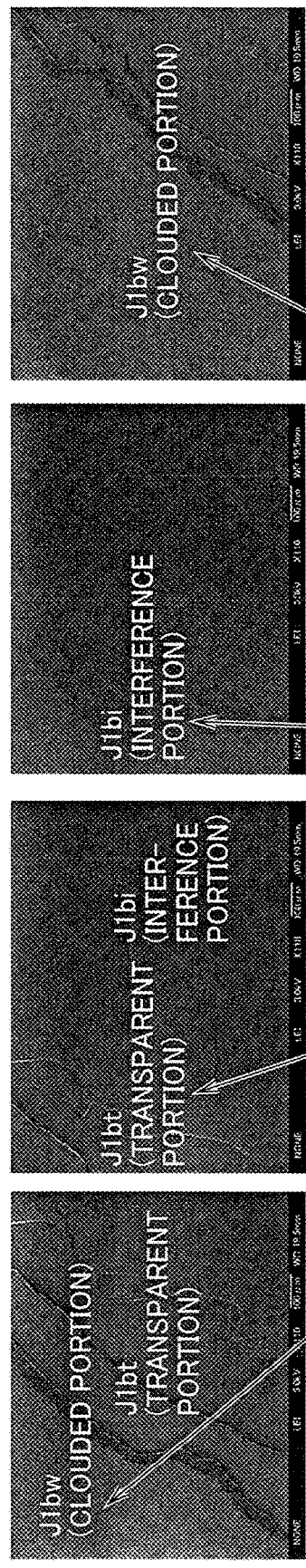
FIG. 28 is an explanatory view explaining measurement results of the surface height of the peeled surface in Example 4.

As shown in FIG. 28, a gradient of the height change was lower in the interference portion J1bi than in the clouded portion J1bw. Moreover, in the transparent portion J1bt, a dent portion D was formed in at some midpoint thereof; however, no dent portion was formed in the interference portion J1bi.

(3) Conclusion

After being irradiated with the laser beam under the irradiation conditions of this example, the upper test piece J1u and the lower test piece J1b were separated, whereby the thin magnesium oxide single crystal substrate with less lattice defects were able to be obtained with ease.

Moreover, at the time of performing this separation, the upper test piece J1u and the lower test piece J1b were separated from the modified layer 22 by the very small tensile rupture stress as mentioned above. Hence, it is thought that the planar peeling is occurring in the modified layer 22.

Moreover, it was seen that, in this separation, the peeled substrate was peeled while peeled tip end positions thereof are being repeated like waving in the vertical direction (a thickness direction of the test piece, that is, a thickness direction of the modified layer 22) in the modified layer 22 formed in the horizontal direction (substrate surface direction).

Moreover, in the peeled surface J1bs, the cyclic pattern J1bp was formed, in which the transparent portion J1bt, the interference portion J1bi and the clouded portion J1bw sequentially appeared and continued with one another. The direction of this continuation was directed to the [01-1] direction.

Then, from measurement results of the height change of this cyclic pattern, it is surmised that the clouded portion J1bw was generated near an upper end of the modified layer 22 (that is, an irradiated side with the laser beam), that the transparent portion J1bt was generated near a lower end of the modified layer 22 (that is, a remote side from the irradiated side with the laser beam), and that the interference portion J1bi was generated at an intermediate portion of the modified layer 22 (that is, an intermediate position in the thickness direction of the modified layer between the clouded portion J1bw and the transparent portion J1bt).

Then, based on observation results of the peeled surface J1bs by the SEM and measurement results of surface roughness of the peeled surface J1bs, it was determined that, at the time of irradiating the test piece J1 with the laser beam B, it was preferable to irradiate the test piece J1 so that the interference portion J1bi was generated on the peeled surface J1bs since it was easy to reduce such irregularities of the peeled surface at the time of peeling the peeled surface.

Example 5

The inventor of the present disclosure carried out an experiment in which the line pitch rp=4 mm in Example 4 (refer to FIGS. 20A to 20C) was changed to a line pitch=7 mm, and performed peeling from the modified layer (separation of an upper test piece and a lower test piece) in a similar way to Example 4. As a result, a major part of the peeled surface of the lower test piece was such a transparent portion, and in addition, it was more difficult to peel the peeled surface than in the case of the line pitch rp=4 mm.

Therefore, it was surmised that narrowing the line pitch rp made it easy to generate the cyclic pattern J1bp, and that extreme widening of the line pitch rp made it easy to generate the transparent portion.

Figure 29:
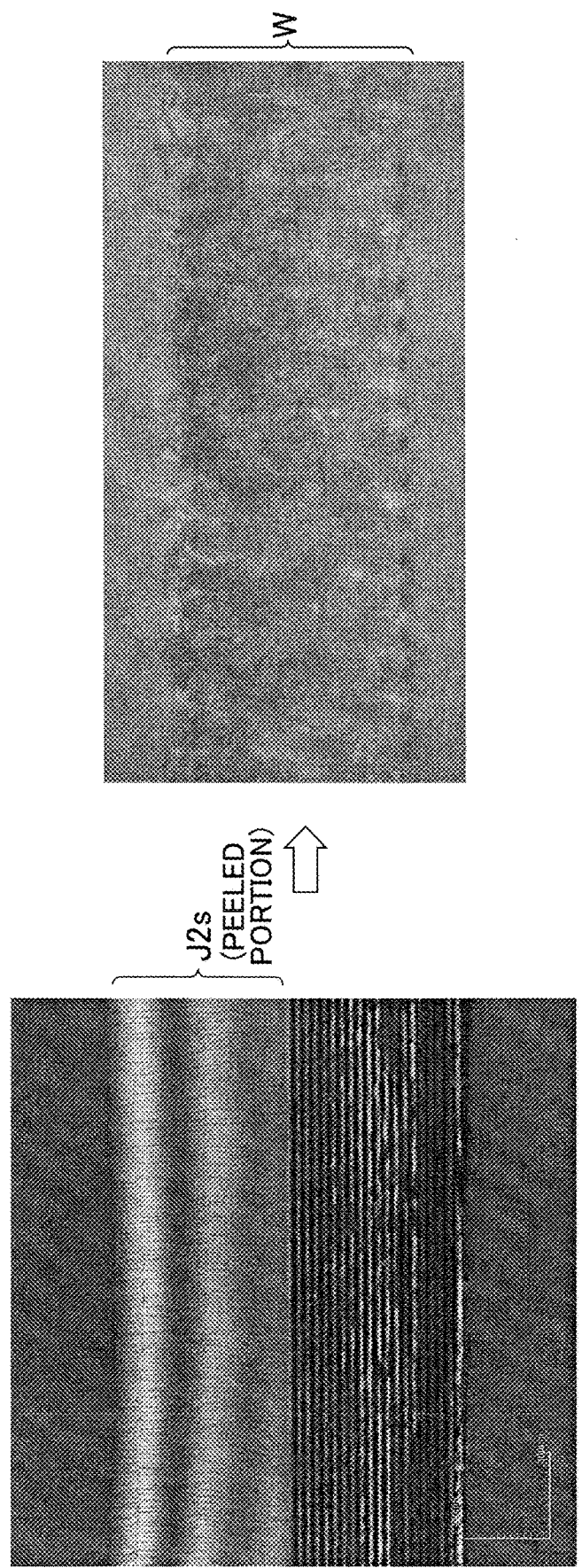
FIG. 29 is a captured image view showing a substrate surface when the laser beam is applied to the same region twice in Example 5.

Accordingly, the inventor of the present disclosure examined a cause to generate the clouded portion J1bw. Then, the inventor of the present disclosure used a test piece J2 cut out of the single crystal magnesium oxide wafer 20u in the same manner as in the test piece J1 used in Example 4, and as shown in FIG. 29, further applied the laser beam to a region in which the peeled portion J2s was formed (that is, the same irradiated position was irradiated for the second time), and observed a surface of the region by the SEM. As a result, a white portion W as an image substantially coinciding with the clouded portion J1bw measured by Example 4 was observed. Hence, it is possible that the clouded portions J1uw and J1bw may be clouded since peeled regions are further irradiated with the laser beam.

Figure 30:
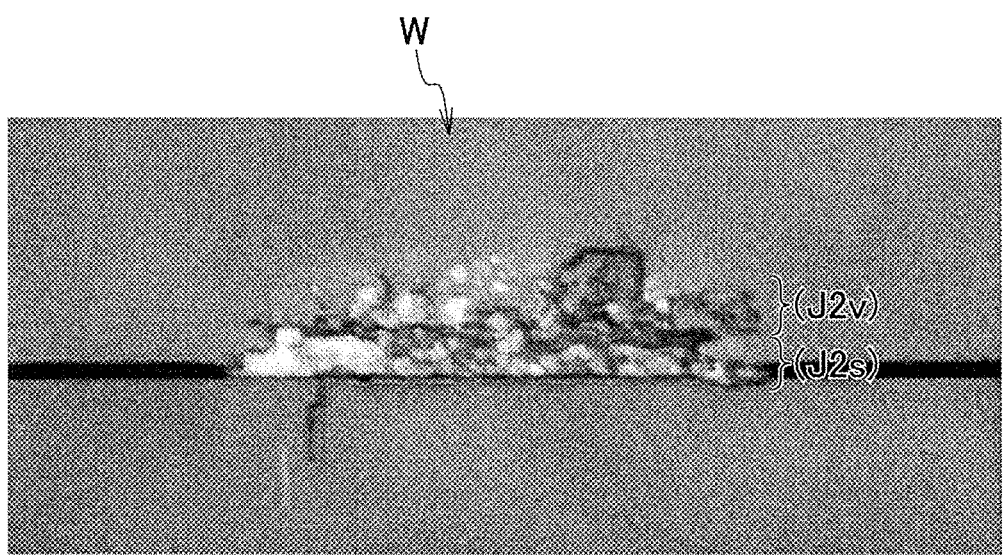
FIG. 30 is a captured image view showing a substrate cross section when the laser beam is applied to the same region twice in Example 5.

Furthermore, the inventor of the present disclosure cut the test piece J2 irradiated twice as described above, thereby exposing a cross section of the white portion W, and observing this cross section by the SEM. As a result, as shown in FIG. 30, an image of the white portion W was such an image that a peeled portion J2v was further stacked on the peeled portion J2s developed earlier.

Example 6

Moreover, as shown in FIGS. 31A and 31B, the inventor of the present disclosure carried out an experiment of irradiating the laser beam while shifting irradiated positions so that the irradiated positions do not overlap each other between first application of the laser beam and second application thereof. Specifically, a position of the test piece J3 was set so that irradiation lines R2 at the second application of the laser beam are located at intermediate positions between the adjacent irradiation lines R1 and R1 at the time of the first application of the laser beam. Note that, in a similar way to the test pieces J1 and J2, the test piece J3 was a piece cut out of the single crystal magnesium oxide wafer 20u. Irradiation conditions are shown in FIG. 32.

Here, in this example, a line pitch rp1 at the first application (an interval between the adjacent irradiation lines at the first application) was 8 μm, and a line pitch rp2 at the second application (an interval between the adjacent irradiation lines at the second application) was also 8 μm. Then, the irradiation lines R2 at the second application were located at intermediate positions between the adjacent irradiation lines R1 at the first application. That is, an interval rpm between the irradiation lines R1 at the first application and the irradiation lines R2 at the second application (that is, a line pitch between the first application and the second application) was 4 μm.

Figure 33A:
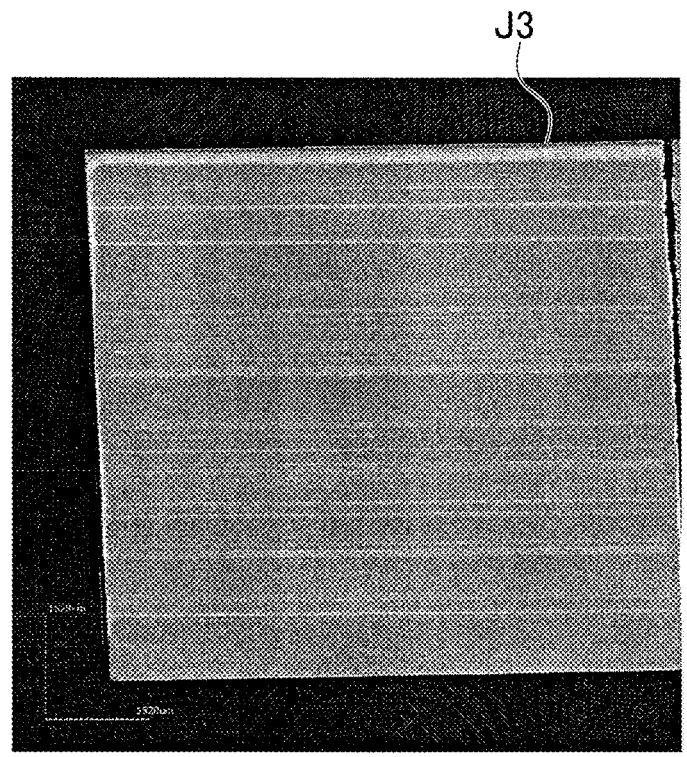
FIG. 33A is a photograph view showing a test piece surface already irradiated with the laser beam in Example 6.
Figure 33B:
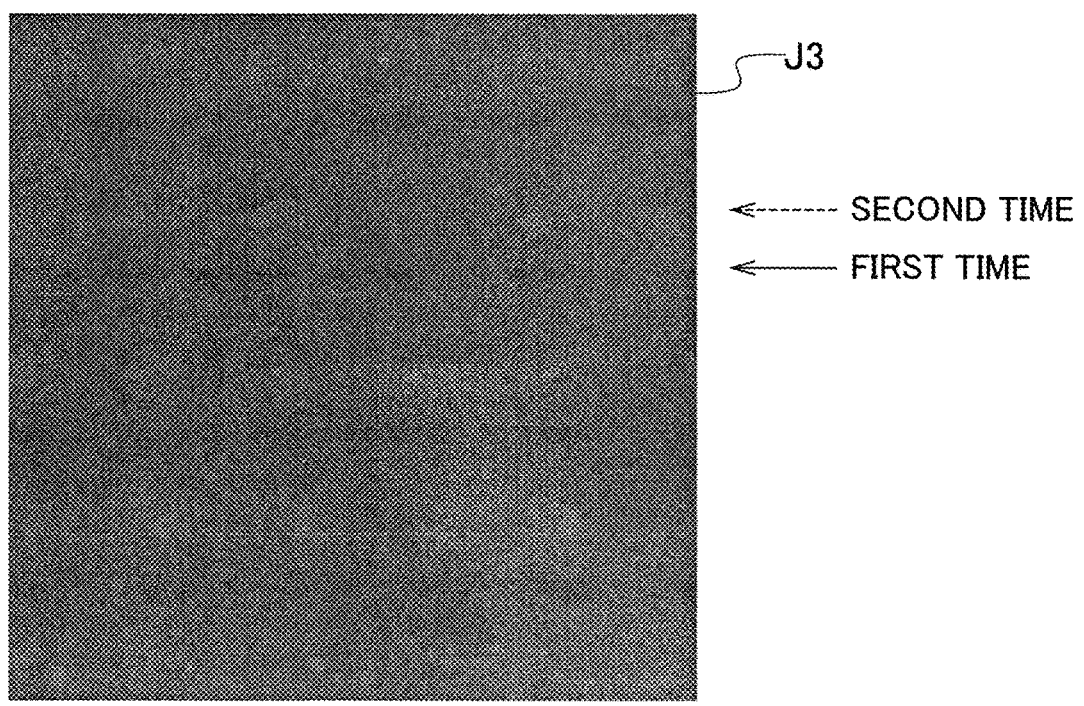
FIG. 33B is a partially enlarged view of FIG. 33A.

An irradiated surface of the test piece J3 already subjected to the second laser beam application was captured from above using the SEM or the like. Capturing results are shown in FIGS. 33A and 33B. In FIG. 33A, linear white portions were observed in a part of the irradiated surfaces; however, no cyclic patter was generated.

Figure 34:
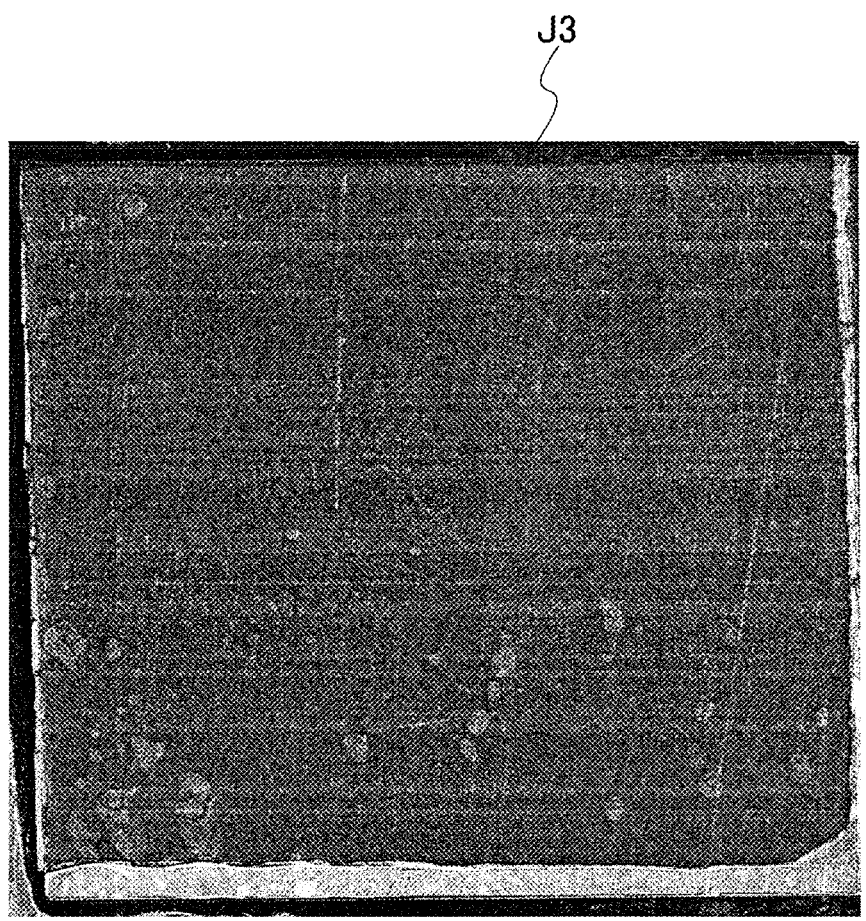
FIG. 34 is a photograph view showing a peeled surface of a test piece in Example 6.
Figure 35A:
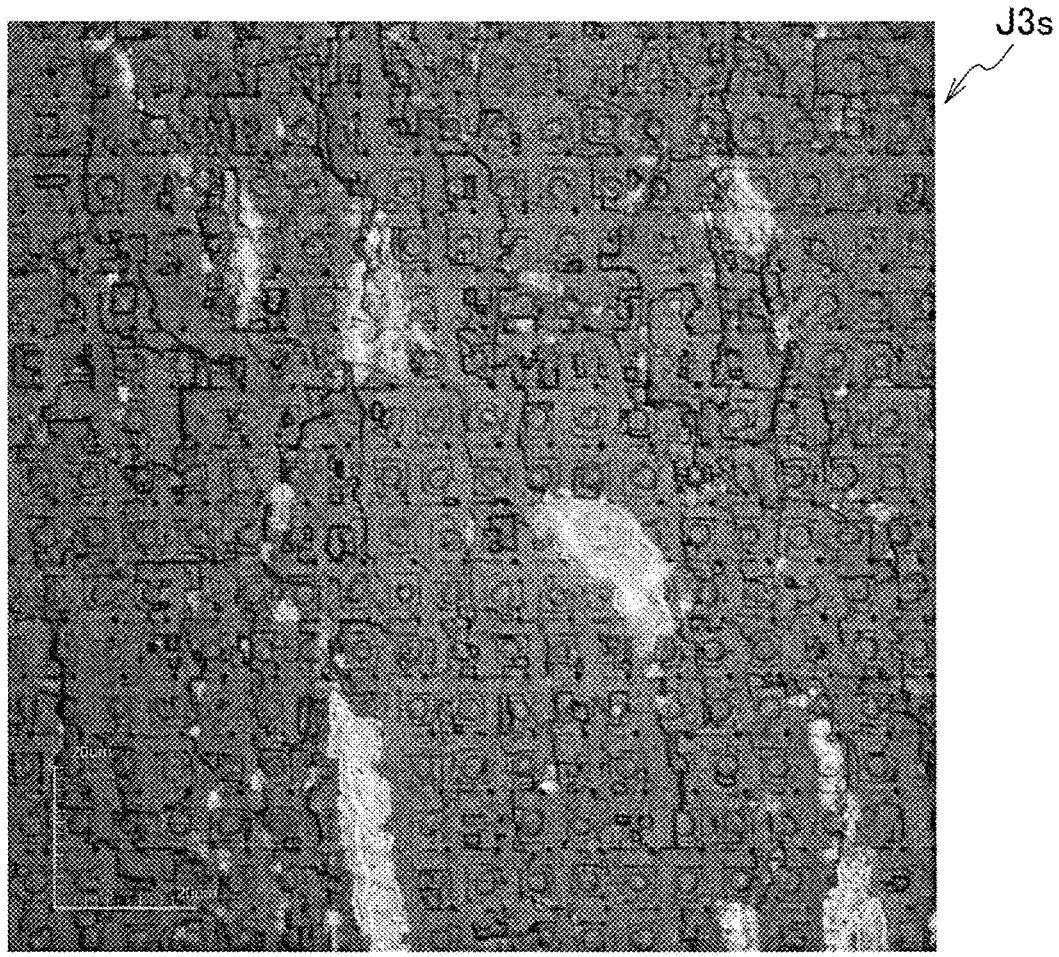
FIG. 35A is a captured image view showing a peeled surface of the test piece in Example 6.
Figure 35B:
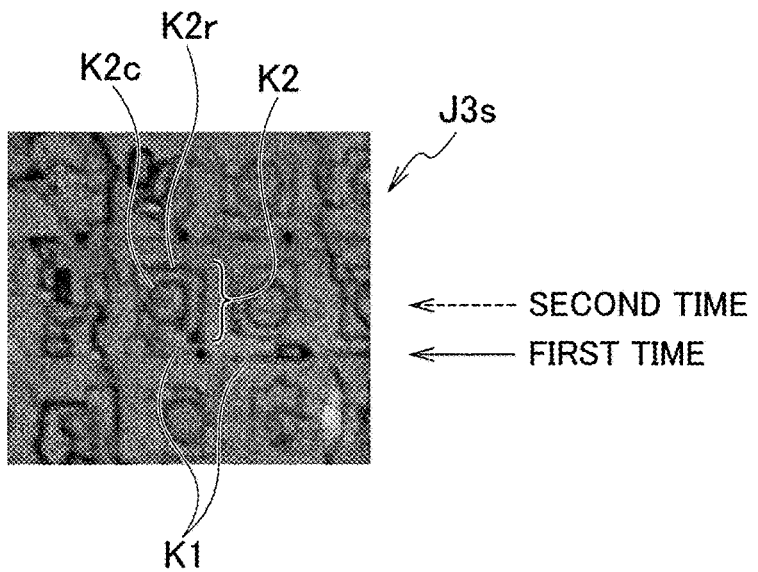
FIG. 35B is a partially enlarged view of FIG. 35A.
Figure 36:
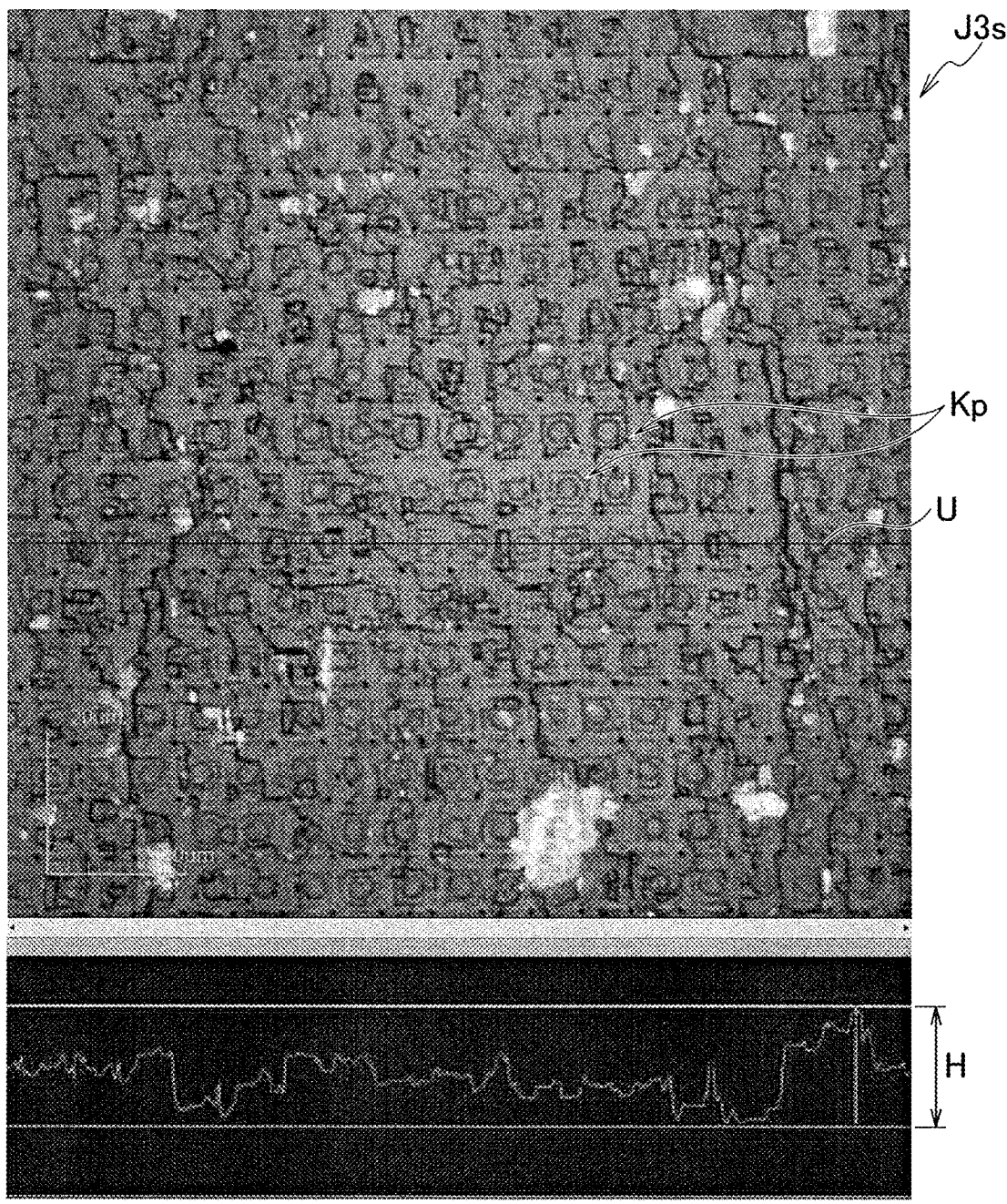
FIG. 36 is an explanatory view explaining measurement positions of a surface height of the peeled surface of the test piece and a measurement result in Example 6.

Thereafter, a peeled surface J3s peeled from a processing layer in a similar way to Example 4 was observed by the SEM or the like. Capturing results are shown in FIG. 34 and FIGS. 35A and 35B. As seen from FIG. 35B, processing marks K1 formed by the first application and processing marks K2 formed by the second application were obviously different in shape from each other. Particularly at the second application, there were formed: annular marks K2c similar to outer peripheries of the hole portions SH (refer to FIG. 26) of the interference portion J1bi formed in Example 4; and square outer edge marks K2r formed so as to surround the respective annular marks K2c. Moreover, though irregular shapes were present on the peeled surface J3s, a maximum height of such irregularities was approximately H=2.62 μm (which was measured at a line U in FIG. 36).

INDUSTRIAL APPLICABILITY

The magnesium oxide single crystal substrate peeled by the present disclosure can be formed efficiently, and accordingly, the peeled substrate obtained from the magnesium oxide single crystal substrate is useful for a high-temperature superconductive film, a ferroelectric film and the like, and is applicable to the field of semiconductor, the field of display, the field energy, and the like.

What is claimed is:

1. A substrate manufacturing method, comprising:
a first step of disposing a condenser for condensing a laser beam in a non-contact manner on a surface of a single crystal member of magnesium oxide to be irradiated;
a second step of irradiating the laser beam to the surface of the single crystal member and condensing the laser beam into an inner portion of the single crystal member under designated irradiation conditions using the condenser and at a same time, two-dimensionally moving the condenser and the single crystal member relatively to each other, and sequentially forming processing marks along irradiation lines; and
a third step of irradiating the laser beam to the surface of the single crystal member and condensing the laser beam into the inner portion of the single crystal member under designated irradiation conditions using the condenser, and at a same time, two-dimensionally moving the condenser and the single crystal member relatively to each other, and sequentially irradiating the laser beam at a center portion between adjacent ones of the irradiation lines formed in the second step and forming processing marks to sequentially generate planar peeling,
wherein the processing marks, formed in the third step, on a peeled surface include annular marks and outer edge marks surrounding the respective annular marks, and she annular marks and the outer edge marks suppress height of irregularities.

2. The substrate manufacturing method according to claim 1,
wherein, in the second step and the third step, a modified layer in which the processing marks are arrayed in a planar shape is formed, and
whereby, the planar peeling is allowed so that uniform processing mark separated portions formed by separating the processing marks from one another are arrayed and formed on a peeled surface of the modified layer, which is remote from an irradiated side thereof.

* * * * *